United States Patent
Gerdes et al.

(10) Patent No.: US 11,729,940 B2
(45) Date of Patent: Aug. 15, 2023

(54) UNIFIED CONTROL OF COOLING IN COMPUTERS

(71) Applicant: ORACLE INTERNATIONAL CORPORATION, Redwood Shores, CA (US)

(72) Inventors: Matthew T. Gerdes, Oakland, CA (US); James Rohrkemper, Harbor Springs, MI (US); Sanjeev R. Sondur, Horsham, PA (US); Kenny C. Gross, Escondido, CA (US); Guang C. Wang, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 17/716,489

(22) Filed: Apr. 8, 2022

(65) Prior Publication Data
US 2023/0137596 A1 May 4, 2023

Related U.S. Application Data

(63) Continuation-in-part of application No. 17/516,975, filed on Nov. 2, 2021.

(51) Int. Cl.
*G06F 1/16* (2006.01)
*H05K 5/00* (2006.01)
(Continued)

(52) U.S. Cl.
CPC ......... *H05K 7/20209* (2013.01); *H05K 7/207* (2013.01); *H05K 7/20136* (2013.01); *H05K 7/20627* (2013.01)

(58) Field of Classification Search
CPC ........... H05K 7/20209; H05K 7/20136; H05K 7/20627; H05K 7/207; H05K 7/20663; H05K 7/20763; H05K 7/208
See application file for complete search history.

(56) References Cited

U.S. PATENT DOCUMENTS

| | | |
|---|---|---|
| 7,020,802 B2 | 3/2006 | Gross et al. |
| 7,281,112 B1 | 10/2007 | Gross et al. |

(Continued)

FOREIGN PATENT DOCUMENTS

| | | |
|---|---|---|
| CN | 107181543 A1 | 9/2017 |
| CN | 110941020 A1 | 3/2020 |

OTHER PUBLICATIONS

Patent Cooperation Treaty (PCT), International Search Report and Written Opinion issued in PCT International Application No. PCT/US2020/060083 dated Mar. 19, 2021 (13 pgs).

(Continued)

*Primary Examiner* — Anthony M Haughton
(74) *Attorney, Agent, or Firm* — Kraguljac Law Group, LLC

(57) ABSTRACT

Systems, methods, and other embodiments associated with unified control of cooling in computers are described. In one embodiment, a method locks operation of first and second cooling mechanisms configured to cool one or more components in the computer. In response to a first condition, the method unlocks the operation of the first cooling mechanism to allow the first cooling mechanism to make cooling adjustments while the operation of the second cooling mechanism is locked. In response to a second condition, the method unlocks the operation of the second cooling mechanism to allow the second cooling mechanism to make cooling adjustments while the operation of the first cooling mechanism is locked. In the method, the first cooling mechanism and the second cooling mechanism are prevented from making the cooling adjustments simultaneously.

20 Claims, 6 Drawing Sheets

(51) Int. Cl.
*H05K 7/00* (2006.01)
*H05K 7/20* (2006.01)

(56) References Cited

U.S. PATENT DOCUMENTS

| | | | |
|---|---|---|---|
| 7,613,576 | B2 | 11/2009 | Gross et al. |
| 7,613,580 | B2 | 11/2009 | Gross et al. |
| 7,702,485 | B2 | 4/2010 | Gross et al. |
| 7,869,977 | B2 | 1/2011 | Lewis et al. |
| 3,069,490 | A1 | 11/2011 | Gross et al. |
| 8,055,594 | B2 | 11/2011 | Dhanekula et al. |
| 8,200,991 | B2 | 6/2012 | Vaidyanathan et al. |
| 8,275,738 | B2 | 9/2012 | Gross et al. |
| 8,341,759 | B2 | 12/2012 | Gross et al. |
| 8,457,913 | B2 | 6/2013 | Zwinger et al. |
| 8,543,346 | B2 | 9/2013 | Gross et al. |
| 8,587,941 | B2* | 11/2013 | Julien-Roux .......... G06F 1/20 361/679.48 |
| 9,507,393 | B2* | 11/2016 | Alshinnawi ........ H05K 7/20781 |
| 9,861,013 | B2* | 1/2018 | Edwards ........... H05K 7/20272 |
| 9,933,338 | B2 | 4/2018 | Noda et al. |
| 10,149,169 | B1 | 12/2018 | Keller |
| 10,452,510 | B2 | 10/2019 | Gross et al. |
| 10,496,084 | B2 | 12/2019 | Li et al. |
| 11,055,396 | B2 | 7/2021 | Gross et al. |
| 2008/0140362 | A1 | 6/2008 | Gross et al. |
| 2008/0252309 | A1 | 10/2008 | Gross et al. |
| 2008/0252441 | A1 | 10/2008 | McElfresh et al. |
| 2008/0256398 | A1 | 10/2008 | Gross et al. |
| 2009/0077351 | A1 | 3/2009 | Nakaike et al. |
| 2009/0099830 | A1 | 4/2009 | Gross et al. |
| 2009/0100848 | A1* | 4/2009 | Kuriyama ............ F28F 17/005 62/132 |
| 2009/0125467 | A1 | 5/2009 | Dhanekula et al. |
| 2009/0306920 | A1 | 12/2009 | Zwinger et al. |
| 2010/0023282 | A1 | 1/2010 | Lewis et al. |
| 2010/0033386 | A1 | 2/2010 | Lewis et al. |
| 2010/0124012 | A1* | 5/2010 | Kondo ..................... G06F 1/20 361/679.47 |
| 2010/0161525 | A1 | 6/2010 | Gross et al. |
| 2010/0305892 | A1 | 12/2010 | Gross et al. |
| 2010/0306165 | A1 | 12/2010 | Gross et al. |
| 2011/0308262 | A1* | 12/2011 | Inadomi ............ H05K 7/20836 62/126 |
| 2012/0030775 | A1 | 2/2012 | Gross et al. |
| 2012/0291465 | A1* | 11/2012 | Kashirajima ...... H05K 7/20836 62/126 |
| 2013/0019627 | A1* | 1/2013 | Yoshikawa ........ H05K 7/20818 62/426 |
| 2013/0157683 | A1 | 6/2013 | Lymberopoulos et al. |
| 2014/0144169 | A1* | 5/2014 | Inaba ........................ G06F 1/20 62/259.2 |
| 2014/0321050 | A1* | 10/2014 | Sato .................. H05K 7/20754 361/679.47 |
| 2015/0137830 | A1 | 5/2015 | Keller, III et al. |
| 2016/0098561 | A1 | 4/2016 | Keller et al. |
| 2016/0330873 | A1* | 11/2016 | Farshchian ........ H05K 7/20672 |
| 2017/0163669 | A1 | 6/2017 | Brown et al. |
| 2018/0011130 | A1 | 1/2018 | Aguayo Gonzalez et al. |
| 2018/0276044 | A1 | 9/2018 | Fong et al. |
| 2018/0320982 | A1* | 11/2018 | Nakamura .......... F28D 15/0275 |
| 2018/0349797 | A1 | 12/2018 | Garvey et al. |
| 2019/0102718 | A1 | 4/2019 | Agrawal |
| 2019/0163719 | A1 | 5/2019 | Gross et al. |
| 2019/0196892 | A1 | 6/2019 | Matei et al. |
| 2019/0197145 | A1 | 6/2019 | Gross et al. |
| 2019/0237997 | A1 | 8/2019 | Tsujii et al. |
| 2019/0243799 | A1 | 8/2019 | Gross et al. |
| 2019/0254198 | A1* | 8/2019 | Magallanes ........ H05K 7/20609 |
| 2019/0286725 | A1 | 9/2019 | Gawlick et al. |
| 2019/0378022 | A1 | 12/2019 | Wang et al. |
| 2020/0201950 | A1 | 6/2020 | Wang et al. |
| 2020/0387753 | A1 | 12/2020 | Brill et al. |
| 2021/0081573 | A1 | 3/2021 | Gross et al. |
| 2021/0158202 | A1 | 5/2021 | Backlawski et al. |
| 2021/0174248 | A1 | 6/2021 | Wetherbee et al. |
| 2021/0270884 | A1 | 9/2021 | Wetherbee et al. |

OTHER PUBLICATIONS

Patent Cooperation Treaty (PCT), International Search Report and Written Opinion issued in PCT International Application No. PCT/US2021/015802 dated May 28, 2021 (13 pgs).

Patent Cooperation Treaty (PCT), International Search Report and Written Opinion issued in PCT International Application No. PCT/US2021/013633 dated May 6, 2021 (10 pgs).

Huang H, et al. "Electronic counterfeit detection based on the measurement of electromagnetic fingerprint," Microelectronics Reliability: an Internat . Journal & World Abstracting Service, vol. 55, No. 9, Jul. 9, 2015 (Jul. 9, 2015) pp. 2050-2054.

Bouali Fatma et al. "Visual mining of time series using a tubular visualization," Visual Computer, Springer, Berlin, DE, vol. 32, No. 1, Dec. 5, 2014 (Dec. 5, 2014), pp. 15-30.

Patent Cooperation Treaty (PCT), International Search Report and Written Opinion issued in PCT International Application No. PCT/US2021/014106 dated Apr. 26, 2021 (9 pgs).

Patent Cooperation Treaty (PCT), International Search Report and Written Opinion issued in PCT International Application No. PCT/US2021/015359 dated Apr. 9, 2021 (34 pgs).

Gou, Yuhua, Implementation of 3d Kiviat Diagrams. (2008). (Year: 2008).

Wang, Ray C., et al., Process Fault Detection Using Time-Explicit Kiviat Diagrams. AIChE Journal 61.12 (2015): 4277-4293.

Garcia-Martin Eva et al., "Estimation of Energy Consumption in Machine Learning," Journal of Parallel and Distributed Computing, Elsevier, Amsterdam, NL, vol. 134, Aug. 21, 2019 (Aug. 21, 2019), pp. 77-88.

Dickey et al.; Checking for Autocorrelation in Regression Residuals; pp. 959-965; Proceedings of 11th Annual SAS Users Group International Conference; 1986.

Hoyer et al.; Spectral Decomposition and Reconstruction of Nuclear Plant Signals; pp. 1153-1158; published Jan. 1, 2005; downloaded on Jul. 14, 2021 from: https://support.sas.com/resources/papers/proceedings-archive/SUGI93/Sugi-93-193%20Hoyer%20Gross.pdf.

Kenny Gross, Oracle Labs; MSET2 Overview: "Anomaly Detection and Prediction" Oracle Cloud Autonomous Prognostics; p. 1-58; Aug. 8, 2019.

Whisnant et al.; "Proactive Fault Monitoring in Enterprise Servers", 2005 IEEE International Multiconference in Computer Science & Computer Engineering, Las Vegas, NV, Jun. 27-30, 2005.

U.S. Nuclear Regulatory Commission: "Technical Review of On-Lin Monitoring Techniques for Performance Assessment vol. 1: State-of-the Art", XP055744715, Jan. 31, 2006, pp. 1-132.

Gribok et al., "Use of Kernel Based Techniques for Sensor Validation in Nuclear Power Plants," International Topical Meeting on Nuclear Plant Instrumentation, Controls, and Human-Machine Interface Technologies (NPIC&HMIT 2000), Washington, DC, Nov. 2000 (1-15 pgs).

Gross et al., "Application of a Model-Based Fault Detection System to Nuclear Plant Signals," May 1, 1997 (5 pgs).

Singer, et al., "Model-Based Nuclear Power Plant Monitoring and Fault Detection: Theoretical Foundations," Intelligent System Application to Power Systems (ISAP '97) Jul. 6-10, 1997 Seoul, Korea (6 pgs).

Patent Cooperation Treaty (PCT), International Search Report and Written Opinion issued in PCT International Application No. PCT/US2021/062380 dated May24, 2022 (10 pgs).

\* cited by examiner

US 11,729,940 B2

UNIFIED CONTROL OF COOLING IN COMPUTERS

CROSS REFERENCE TO RELATED APPLICATIONS

This disclosure is a continuation-in-part of and claims the benefit of priority to U.S. patent application Ser. No. 17/516,975" filed Nov. 2, 2021, titled "Detection of Feedback Control Instability in Computing Device Thermal Control", having inventors James Rohrkemper, Sanjeev R. Sondur, Kenny C. Gross, and Guang C. Wang, and assigned to the present assignee, the entirety of which is incorporated herein by reference.

BACKGROUND

Computing devices need to be maintained within an acceptable temperature range during operation, or risk failure of one or more components. Thermal control systems, for example, cooling systems, are included in computing devices to maintain temperature within the acceptable range.

Control of cooling systems in computing devices can unexpectedly and spontaneously enter sinusoidal oscillations between high provisioning and low provisioning levels. These control oscillations create swings or oscillations in temperature in the computing device, and may cause excessive vibration due to fan speed. The cooling systems are unlikely to spontaneously recover from these oscillations. These thermal control oscillations cause substantial wastage in energy for the computing device, significantly lower compute performance of the computing device, and degrade long term reliability of the computing device.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments one element may be implemented as multiple elements or that multiple elements may be implemented as one element. In some embodiments, an element shown as an internal component of another element may be implemented as an external component and vice versa. Furthermore, elements may not be drawn to scale.

DETAILED DESCRIPTION

Figure 1:
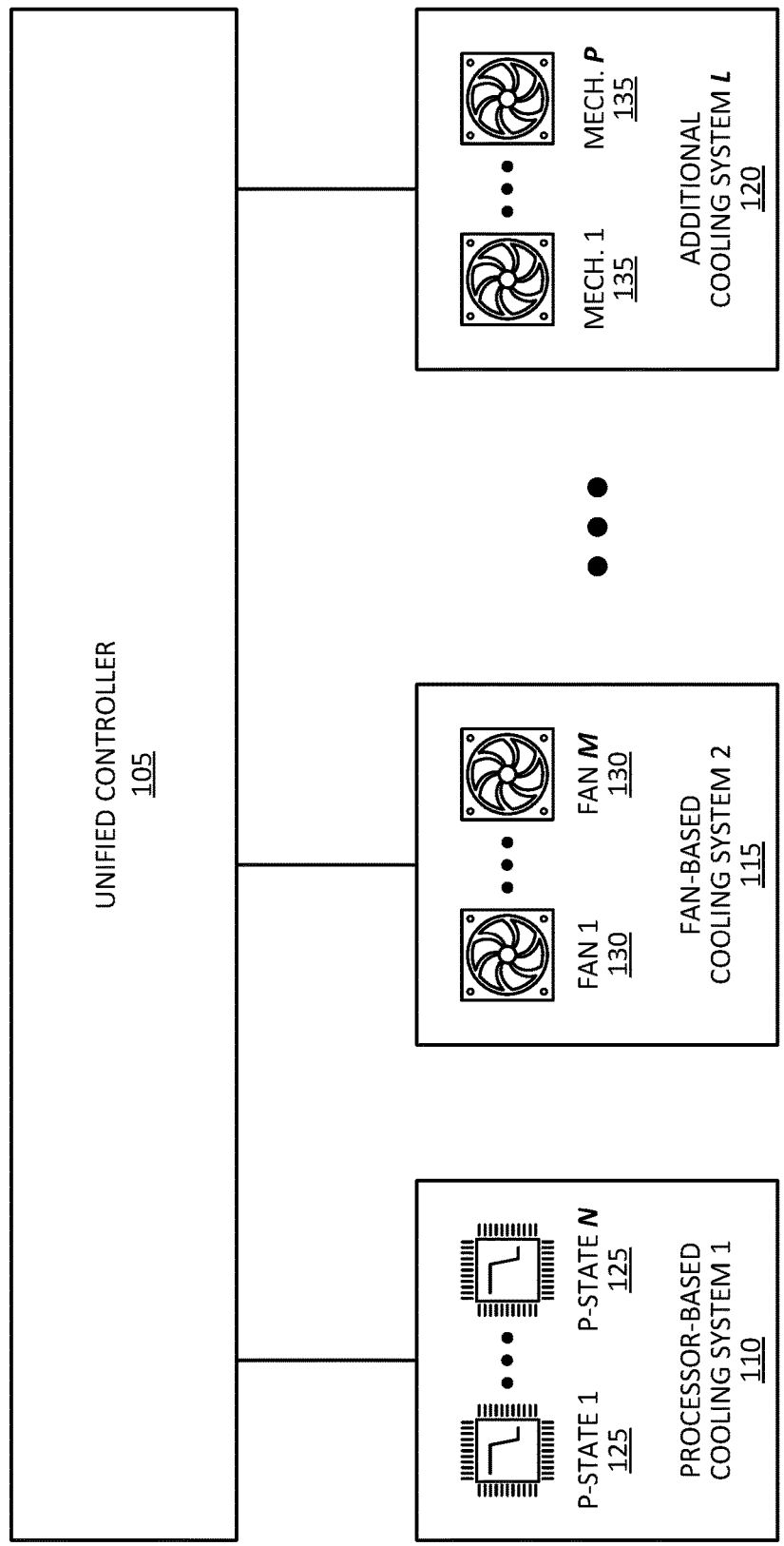
FIG. 1 illustrates one embodiment of a unified cooling system 100 associated with unified control of cooling in computers with multiple otherwise independent cooling systems.

Systems, methods, and other embodiments are described herein, in one embodiment, that provide unified control of cooling in computers with multiple otherwise independent cooling systems. In one embodiment, a unified controller locks operation of a fan-based cooling mechanism (or other fluid-based cooling mechanism) while allowing a processor-based cooling mechanism (or other power-based cooling mechanism) to operate and make cooling adjustments, and then allows the fan-based cooling mechanism to operate and make cooling adjustments after locking operation of the processor-based cooling mechanism. The processor-based cooling mechanisms and fan-based cooling mechanisms are thus prevented from making cooling adjustments simultaneously. Because a main cause of oscillations in thermal control is due to simultaneous independent operation of local temperature/thermal management systems, using the unified controller may, for example, mitigate, reduce, or even eliminate the oscillations.

In one embodiment, the unified controller may extend locking control over one or more processor-based cooling mechanisms, one or more fan-based cooling mechanisms, and/or one or more other cooling mechanisms. In one embodiment, one or more of the cooling mechanisms may be manufactured, for example by different companies, as a stand-alone or self-contained device. Thus, each cooling mechanism is configured to operate independently. As such, when multiple cooling mechanisms are added to a computing device, they each operate independent from each other, which may cause oscillation issues. The present unified controller is configured to provide a centralized and coordinated control over multiple cooling systems that are configured to operate independently from each other. The present unified controller may be added and retrofitted into an existing computing system or configured into a new architecture of a system.

In one embodiment, the unified controller may provide prioritized, turn-based control of multiple thermal management systems in computers such as enterprise servers. In one embodiment, the unified controller may provide unified supervisory control over individual, independent "local" management or control systems for adjusting or regulating the same environmental factor, such as temperature. In one embodiment, the unified controller may provide top-level supervision that allows all the individual "local" control algorithms in the enterprise server—which in one example enterprise server includes over three dozen local controllers—to operate in a turn-based, "round robin" sequential fashion in which no local controllers act simultaneously. In another embodiment, a selected group of local controllers (e.g., a subset of all local controllers, less-than-whole) are operated in a turn-based sequence while one or more non-selected local controllers may be allowed to operate independently, which may cause some to function simultaneously.

In one embodiment, the unified controller may override operation of the local thermal management system, prohibiting instructions by the local thermal management system during certain conditions, and allowing the instructions during a turn. In one embodiment, the local thermal management system is prevented from acting out of turn, but permitted to exercise control according to its own algorithm during a turn assigned by the systems, methods, and other embodiments described herein.

In one embodiment, the unified supervisory control is prioritized or hierarchical: the fastest-acting controllers are given top-level priority for action, and slower acting controllers are subordinated. This hierarchical action may also be subject to the constraint of turn-based behavior discussed above. Due to their speed of control action and response, central processing unit (CPU) Dynamic Voltage and Frequency Scaling (DVFS) performance state (or P-State) controllers are placed near or at the top of the hierarchy. This is one type of processor-based cooling mechanism, which is in general referred to herein as a power-based cooling system/mechanism. The CPU DVFS P-State controllers act with a millisecond-to-microsecond feedback/control response to throttle back and/or reduce processor frequency and power, thereby reducing the heat generated from the CPU and cooling/reducing the temperature.

Fan-speed controllers are placed lower in the hierarchy due to their slower feedback/control response. Thermal inertia alone dictates that fans take time to effect a reduction in the temperature of a component. This slower feedback/control response time for fan-speed controllers may be further lengthened by the time-lag of bus delay (multiple seconds in an Inter-Integrated Circuit (I2C) bus). Thus fan-speed controllers operate with a feedback/control response time on the order of seconds to increase fan speed, thereby increasing the cooling of heat-dissipating components. Other cooling systems may be placed in the hierarchy based on the speed with which the cooling system effects a cooling response in a component.

No action or function described or claimed herein is performed by the human mind. An interpretation that any action or function can be performed in the human mind is inconsistent with and contrary to this disclosure.

—Example Unified Cooling System—

FIG. 1 illustrates one embodiment of a unified cooling system 100 associated with unified control of cooling in computers with multiple otherwise independent cooling systems. Unified cooling system 100 includes a unified controller 105 configured to control multiple, otherwise independent cooling systems that are configured to operate independently from each other. The otherwise independent cooling systems may include, for example, processor-based cooling system 1 110 and fan-based cooling system 2 115. In one embodiment, the otherwise independent cooling systems may include a number (L) of cooling systems, as represented by additional cooling system L 120. For example, a power-supply-fan-based cooling system may be one of the cooling systems.

In one embodiment, the otherwise independent cooling systems 110, 115, 120 include various cooling mechanisms that cause a cooling response or reduction in temperature in one or more components of a computer. In one embodiment, processor-based cooling system 110 includes a number (N) of DVFS P-State controllers 125 as cooling mechanisms. In one embodiment, fan-based cooling system 115 includes a number (M) of fans 130 as cooling mechanisms. In one embodiment, additional cooling system 120 includes a number (P) of additional cooling mechanisms 135. For example, where the additional cooling system 120 is a power-supply-fan-based cooling system, the additional cooling mechanisms 135 may be power supply fan (that is, a fan integrated with or otherwise configured to primarily cool a power supply unit of a computer). Note that although FIG. 1 is discussed with P-state controllers 125 as one example of a power-based cooling system, and with fan-based cooling system 130 and power-supply-fan-based cooling system 135 as examples of fluid-based cooling systems, the cooling systems of unified cooling system 100 are not limited thereto.

In one embodiment, the cooling systems 110, 115, 120 and their respective cooling mechanisms 125, 130, 135 may be used for cooling one or more components in a computer. The various cooling mechanisms may contribute in greater or lesser degree to the cooling of the one or more components.

In one embodiment, the various cooling mechanisms are controllable to allow adjustment to greater or lesser provisioning of cooling. The adjustments result in greater or lesser cooling effect on one or more components. In one embodiment, the various cooling mechanisms are individually controllable so that one cooling mechanism may be adjusted while not making an adjustment to another cooling mechanism. In one embodiment, the various cooling mechanisms are controllable in groups of sizes up to and including the full number of cooling mechanisms in a cooling system. In this way, the unified controller may exercise coarse or fine control over provisioning (or delivery) of cooling.

As will be described in further detail herein, in one embodiment, unified controller 105 exercises hierarchical and turn-based control over the otherwise independent cooling systems 110, 115, 120 and their respective associated cooling mechanisms 125, 130, 135. In one embodiment, the unified controller 105 may control the operation of a cooling mechanism by locking the operation of the cooling mechanism to cause the cooling mechanism to continue to provide or deliver a consistent level of cooling, and disallow adjustment to the level of cooling by the cooling mechanism. In one embodiment, the unified controller may control the operation of a cooling mechanism by unlocking the operation of a cooling mechanism to allow or permit the cooling mechanism to adjust or change a level of cooling provided or delivered by the cooling mechanism.

Configuration of the cooling systems to operate independently allows simultaneous operation or adjustment of their cooling mechanisms. This simultaneous adjustment may lead to control oscillations. Therefore, in one embodiment, the unified controller 105 is configured to prohibit different cooling mechanisms from making simultaneous or independent cooling adjustments In one embodiment, by locking selected cooling mechanisms and unlocking other cooling mechanisms, the unified controller may be configured to sequentially control operation of cooling mechanisms to implement turn-based control. Thus, in one embodiment, it is the "turn" of the unlocked cooling mechanism(s) to make cooling adjustments, and it is not the "turn" of the locked cooling mechanisms to make cooling adjustments. In one embodiment, a turn of a cooling mechanism occurs while the operation of the cooling mechanism is unlocked while operation of other cooling mechanisms controlled by the unified controller is locked.

In one embodiment, these turns may be rendered hierarchical or prioritized when the turns for cooling mechanisms are grouped according to the rapidity or speed by which an adjustment to the level of cooling supplied by the cooling mechanism accomplishes a reduction in temperature.

In one embodiment, operation of unified cooling system 100 will be described with reference to an example method 200 shown in FIG. 2. In one embodiment, an example implementation of unified cooling system 100 will be described with reference to enterprise server 300 shown in FIG. 3. In one embodiment, example hierarchical and turn-based aspects of the operation of unified cooling system 100 will be described with reference to an example method 400 shown in FIG. 4. In one embodiment, operation of unified cooling system 100 will be described with reference to another example method 500 shown in FIG. 5.

—Example Method for Unified Control of Cooling in a Computer—

Figure 2:
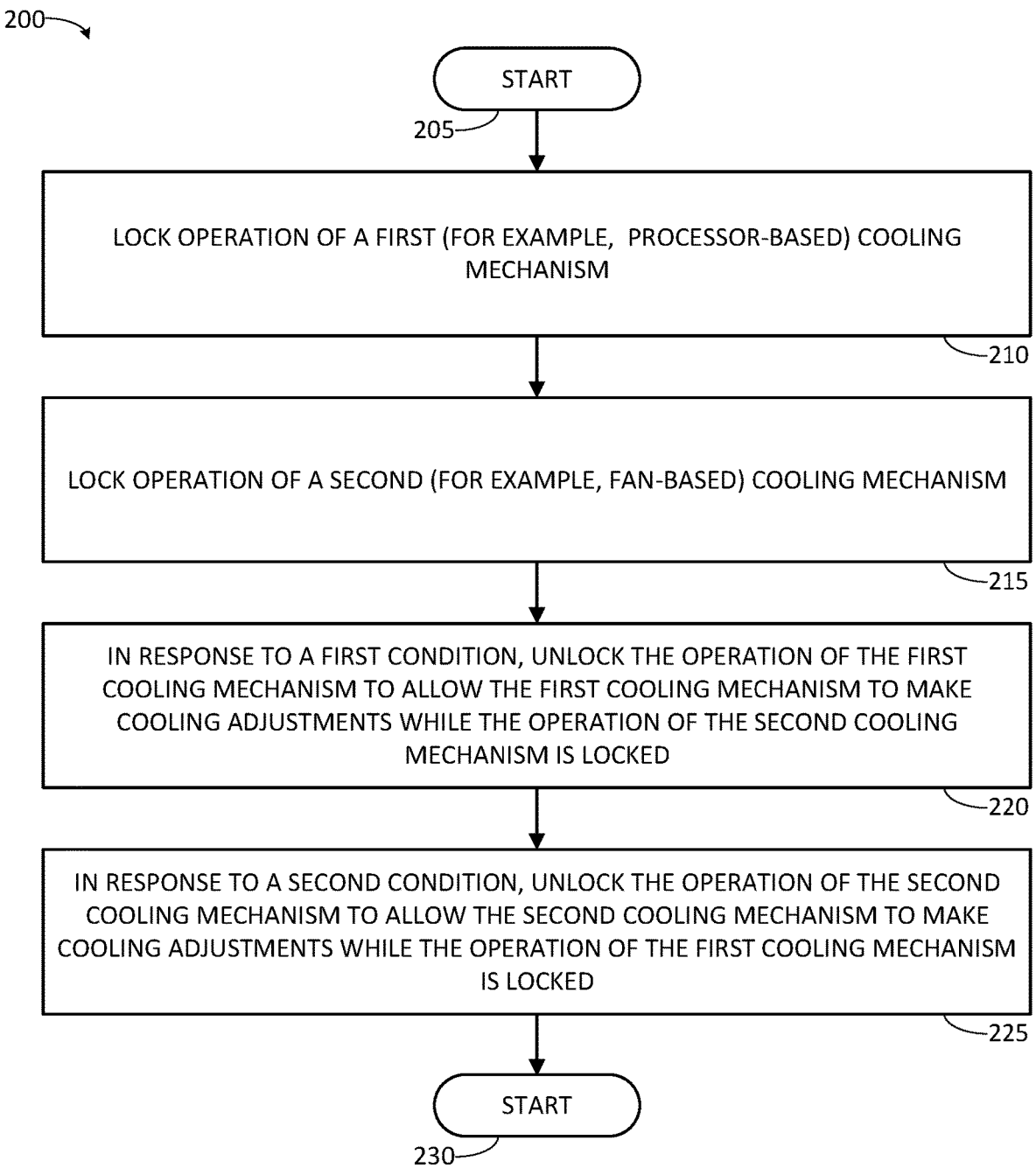
FIG. 2 illustrates one embodiment of a unified control method 200 associated with unified control of cooling in computers with multiple otherwise independent cooling systems.

FIG. 2 illustrates one embodiment of a unified control method 200 associated with unified control of cooling in computers with multiple otherwise independent cooling systems. As an overview, in one embodiment, unified control method 200 is a method for unified control of cooling in a computer. Initially, unified control method 200 locks the operation of both a processor-based cooling mechanism and a fan-based cooling mechanism. The processor-based cooling mechanism and the fan-based cooling mechanism are configured to cool one or more components in the computer. In response to a first condition (described in more detail elsewhere herein) the operation of the processor-based cooling mechanism is unlocked. This allows the processor-based cooling mechanism to make cooling adjustments while the operation of the fan-based cooling mechanism is locked. In response to a second condition (described in more detail elsewhere herein), the operation of the fan-based cooling mechanism is unlocked. This allows the fan-based cooling mechanism to make cooling adjustments while the operation of the processor-based cooling mechanism is locked. For example, the fan-based cooling mechanism may be unlocked after locking the operation of the processor-based cooling mechanism. The processor-based cooling mechanism and the fan-based cooling mechanism are prevented from making the cooling adjustments simultaneously.

In one embodiment, the unified control method 200 initiates at START block 205 in response to a processor determining one or more of: (i) a computer equipped with a unified cooling system (such as unified cooling system 100) 100 has commenced operating or is continuing to operate; (ii) a computer equipped with a unified cooling system is powered on; (iii) a user (or administrator) of a computer equipped with a unified cooling system has initiated method 200, or (iv) that method 200 should commence in response to occurrence of some other condition. Processing continues to process block 210.

At process block 210, the processor locks operation of a processor-based cooling mechanism. The processor-based cooling mechanism is configured to cool one or more components in the computer.

In one embodiment, the processor-based cooling mechanism is configured to apply voltage and frequency scaling to adjust performance of a component, for example by throttling or restricting performance. In one embodiment, the processor-based cooling mechanism is a DVFS P-state controller associated with a CPU or other processor. The P-state controller is configured to adjust P-states that govern the voltage and/or frequency at which the CPU operates in response to detected temperatures of the CPU. In one example, a higher P-state number indicates a greater restriction on the CPU operation, slowing the CPU, and reducing the heat generated by the CPU. Thus, in one embodiment, the CPU is one of the one or more components in the computer that is cooled by the processor-based DVFS cooling mechanism. Other components of the computer may also be associated with and have performance throttled by a DVFS P-state controller.

In one embodiment, the processor locks operation of the processor-based cooling mechanism by preventing the processor-based cooling mechanism from making any change to the level of cooling it provides. In one embodiment, the processor locks operation of the P-state controller by preventing any change to the P-state. For example, the processor may block or intercept commands to change the P-state while the operation is locked. In one embodiment, blocking or intercepting the commands prevents the commands from reaching the P-state controller. In one embodiment, blocking or intercepting the commands prevents the commands from being created.

Process block 210 then completes, and processing continues at process block 215. At the completion of process block 210, no cooling adjustments may be made by the processor-based cooling mechanism until operation of the processor-based cooling mechanism is unlocked. In one embodiment, operation of the processor-based cooling mechanism will not be unlocked until a turn associated with the processor-based cooling mechanism occurs. Thus, in one embodiment, the CPU will continue to operate in the same P-state while operation of the processor-based cooling mechanism is locked.

At process block 215, the processor locks operation of a fan-based cooling mechanism. The processor-based cooling mechanism is also configured to cool the one or more components in the computer.

In one embodiment, the fan-based cooling mechanism is a variable-speed fan associated with and providing cooling for a component of the computer, such as the CPU. In one embodiment, the variable speed fan is configured to operate at different levels of rotational speed. For example, a higher fan speed delivers a higher level of cooling to the component to remove more heat and reduce the temperature of the component. In another example, a lower fan speed delivers a lower level of cooling to the component, removing less heat and allowing the temperature of the component to rise.

In one embodiment, the level of speed may be adjusted in response to a speed control signal, such as a pulse width modulation (PWM) signal. In one embodiment, the speed control signal is pulse-width modulated power delivered to the variable speed fan. In one embodiment, the speed control signal is a PWM control signal that caused the variable speed fan to pulse-width modulate power that is delivered to the variable speed fan.

In one embodiment, the processor locks operation of the fan-based cooling mechanism by preventing any changes to the level of cooling provided by the fan-based cooling mechanism. In one embodiment, the processor locks operation of the variable speed fan by preventing any change to the speed control signal. For example, the processor may block or intercept commands to a fan controller that governs the variable speed fan that is meant to change the fan speed. In one embodiment, blocking or intercepting the commands prevents the commands from reaching the fan controller, and so the fan controller will not execute the blocked or intercepted command. In one embodiment, blocking or intercepting the commands prevents the commands from altering the speed control signal to the variable speed fan.

Process block 215 then completes, and processing continues at process block 220. At the completion of process block 215, no cooling adjustments may be made by the fan-based cooling mechanism until operation of the fan-based cooling mechanism is unlocked. In one embodiment, the operation of the fan-based cooling mechanism will remain locked until a turn associated with the fan-based cooling mechanism occurs. Thus, in one embodiment, the variable speed fan will continue to rotate at a constant speed level while operation of the fan-based cooling mechanism is locked.

At process block 220, in response to a first condition, the processor unlocks the operation of the processor-based cooling mechanism to allow the processor-based cooling mechanism to make cooling adjustments while the operation of the fan-based cooling mechanism is locked. In one embodiment, the processor assigns a first turn in a series of turns to the processor-based cooling mechanism. In one embodiment, the first condition is satisfied when the first turn occurs. In one embodiment, the first turn occurs when all turns preceding the first turn have completed, and no cooling adjustments were made in the preceding turns. Thus, the first condition is satisfied when all preceding turns that came before the first turn have occurred, and no cooling adjustment is made to a cooling mechanism associated with one of the preceding turns.

In one embodiment, to unlock the operation of the processor-based cooling mechanism, the processor allows the processor-based cooling mechanism to change the level of cooling it provides. In one embodiment, the processor unlocks operation of the P-state controller by permitting the P-state to change. For example, the processor may cease blocking or intercepting commands to change the P-state while the operation is unlocked, thus allowing the commands to be created and reach the P-state controller.

Process block 220 then completes, and processing continues at process block 225. At the completion of process block 220, the processor-based cooling mechanism is free to make cooling adjustments such as P-state changes, while the fan-based cooling mechanism is constrained to operate at a constant level.

At process block 225, in response to a second condition, the processor unlocks the operation of the fan-based cooling mechanism to allow the fan-based cooling mechanism to make cooling adjustments while the operation of the processor-based cooling mechanism is locked. In one embodiment, the processor assigns a second turn in the series of turns to the fan-based cooling mechanism. In one embodiment, the second condition is satisfied when the second turn occurs. In one embodiment, the second turn occurs when all turns preceding the second turn have completed, and no cooling adjustments were made in the preceding turns. In one embodiment, the first turn is included in the turns that precede the Thus, the second condition is satisfied when all preceding turns that came before the second turn have occurred, and no cooling adjustment is made to a cooling mechanism associated with one of the preceding turns.

In one embodiment, to unlock the operation of the fan-based cooling mechanism, the processor allows the fan-based cooling mechanism to change the level of cooling it provides. In one embodiment, the processor unlocks operation of the variable speed fan by permitting changes to the speed control signal. For example, the processor may cease blocking or intercepting commands to change the speed control signal while the operation is unlocked, thus allowing the commands to be created and alter the speed of the variable speed fan.

Process block 225 then completes, and processing continues to END block 230, where method 200 ends. At the completion of process block 225, the fan-based cooling mechanism is free to make cooling adjustments such as changes to fan speed, while the processor-based cooling mechanism is constrained to operate at a constant level. In this way, in one embodiment, the processor-based cooling mechanism and the fan-based cooling mechanism are prevented from making the cooling adjustments simultaneously. Instead, in one embodiment, the unified controller is further configured to sequentially control the operation of the processor-based cooling mechanism and the fan-based cooling mechanism. In one embodiment, this sequential control is accomplished by assigning turns to the cooling mechanisms.

In one embodiment, the turns are cut off and the turns restart when a cooling adjustment is made in a turn. Thus, in one embodiment, in response to occurrence of the cooling adjustments during the first turn or the second turn, the processor returns to an initial turn in the series of turns. When a cooling adjustment to the level of cooling delivered by a cooling mechanism associated with a turn is made, the processor does not proceed to a next turn in the series as described above. Instead, the processor returns to an earlier turn that precedes the current turn in the series. In one embodiment, the earlier turn is an initial turn of the series which is not preceded by other turns.

In one embodiment, the turns continue to occur sequentially while no cooling adjustment is made in a turn. Thus, in one embodiment, in response to no occurrence of the cooling adjustments during the first turn or the second turn, advancing to a next turn in the series. In one embodiment, the next turn in the series is a turn that immediately follows the current turn in the series, without intervening turns between the current turn and the next turn. Thus, for example, the next turn for the first turn is the turn that comes directly after the first turn in the series of turns. In one embodiment, the next turn for the first turn may be the second turn, where the turn for the processor-based cooling mechanism is immediately followed by the turn for the fan-based cooling mechanism.

In one embodiment, the cooling mechanisms are assigned turns based on speed with which the cooling mechanism effects a cooling response in the one or more components. In one embodiment, due to hierarchy or prioritization of turns, the earlier turns in the series are associated with cooling mechanisms that have a faster or equally fast cooling response to the later turns in the series. The return to an earlier or initial turn in the series ensures that any effect of a cooling adjustment may be promptly evaluated for a rapid response by faster cooling mechanisms associated with the earlier turns. Thus, later turns associated with slower cooling mechanisms are reached when the faster cooling mechanisms associated with earlier turns are operating stably at constant cooling levels, without making cooling adjustments. In one embodiment, this contributes to the mitigation of control oscillations.

This prioritization may be rough or approximate, based on expected speed of cooling response. For example, a power-based cooling system/mechanism (which includes processor-based cooling mechanisms) is faster than a fan-based cooling mechanism and would have an earlier turn in the series. But, for example, the first of two processor-based cooling mechanisms may be slightly slower than the second of two processor-based cooling mechanisms, and still receive an earlier turn in the series. In one embodiment, the prioritization of turns in the series is in blocks. The blocks of turns are assigned to cooling mechanisms of similar speed in achieving a cooling effect, without any particular order within the blocks. For example, processor-based cooling mechanisms with microsecond to millisecond cooling response times are grouped together in an earlier block. Fan-based cooling mechanisms with multi-second cooling response times are grouped together in a later block. Power-supply-fan-based cooling mechanisms, having even longer cooling response times to effect a cooling response, are grouped together in an even later block of the series.

In one embodiment, the unified control of cooling described with reference to method 200 is implemented in an enterprise server 300 as shown FIG. 3 in order to maintain stability among multiple otherwise independent cooling systems of enterprise server 300.

—Example Deployment Environment—

As used herein, an "enterprise server" or "enterprise computing system" refers to a computing device configured with compute hardware to process heavy workloads (for example, workloads at the scale of an enterprise, instead of at the scale of an individual user) at high speed with high reliability, for example by having high processing throughput, large memory and/or storage. Some enterprise servers are configured to be managed as part of a group in a datacenter. Enterprise server configurations may include, but are not limited to, a server computer, a server blade, and a datacenter server. Examples of enterprise servers include (but are not limited to) Oracle® SPARC, Oracle Exadata, Dell PowerEdge, Fujitsu Primergy and Primequest, IBM Power System, and HP Proliant server computers.

Figure 3:
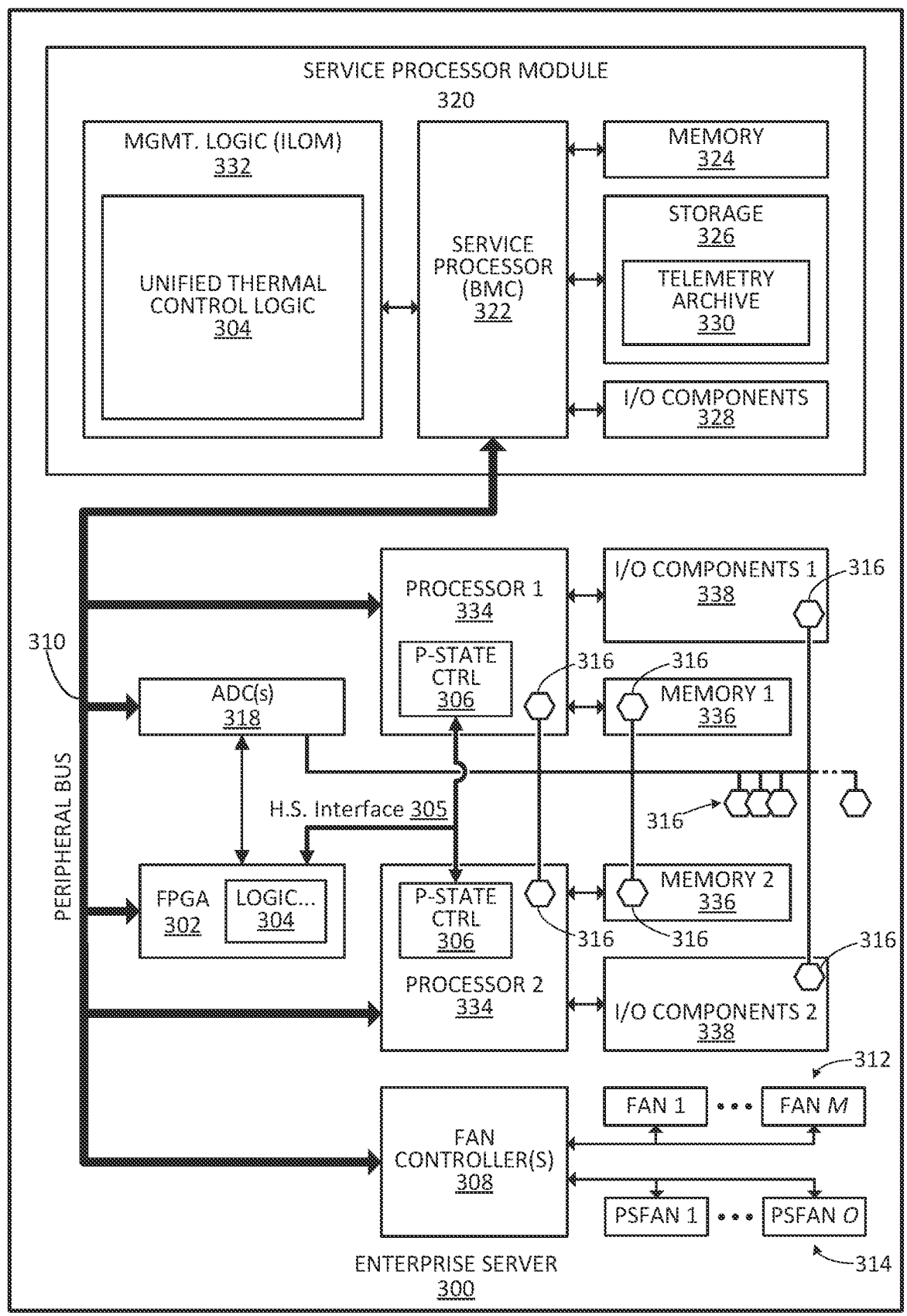
FIG. 3 illustrates one embodiment of an example enterprise server 300 associated with unified control of cooling in computers with multiple otherwise independent cooling systems.

FIG. 3 illustrates one embodiment of an example enterprise server 300 associated with unified control of cooling in computers with multiple otherwise independent cooling systems. In one embodiment, cooling in computers includes both reduction of heat production in computer components and removal of heat generated by computer components. In one embodiment, one type of cooling system is a power-based cooling system for reducing heat produced by a heat-generating computer component. In one embodiment, one type of cooling system is a fluid-based cooling system for removing or transferring away heat produced by a heat-generating computer component.

In one embodiment, the multiple otherwise independent cooling systems include power-based cooling systems for adjusting operational parameters or settings of computer components to cause the component to generate less heat. While systems and methods are discussed herein with dynamic voltage and frequency scaling (DVFS) P-state control (or other processor-based control) given as an example of power-based cooling systems, the systems and methods are not limited to DVFS P-state control for power-based cooling. Other examples of power-based cooling systems are described in further detail elsewhere herein.

In one embodiment, the multiple otherwise independent cooling systems include fluid-based cooling systems for removing a heated fluid from a location in the computer and replacing it with a cooler fluid. While systems and methods are discussed herein with fan-based cooling systems given as an example of fluid-based cooling systems, the systems and methods are not limited to fan control for fluid-based cooling. Other examples of fluid-based cooling are described in further detail elsewhere herein.

In one embodiment, enterprise server 300 includes a logic circuit 302 configured to operate as a unified controller of multiple otherwise independent cooling systems of enterprise server 300. In one embodiment, logic circuit 302 is a field programmable gate array (FPGA), application-specific integrated circuit (ASIC), or other logic circuit configured with unified thermal control logic 304 to execute a method for unified control of cooling in a computer, such as unified control method 200. In one embodiment, logic circuit 302 is in communication with P-state controllers 306 through a high-speed interface 305. In one embodiment, logic circuit 302 is in communication with fan controllers 308 through peripheral bus 310. In one embodiment, fan controllers 308 are configured to issue speed control signals to main fans 312 and/or power supply fans 314.

In one embodiment, logic circuit 302 may exercise control over P-state controllers 306 through high-speed interface 305. For example, logic circuit 302 may lock operation of P-state controllers 306 to constrain or require P-state controllers 306 to remain in a P-state. Or, for example, logic circuit 302 may unlock operation of P-state controllers 306 to allow P-state controllers 306 to change P-state. In one embodiment, logic circuit 302 may exercise control over main fans 312 through peripheral bus 310 and fan controllers 308. For example, logic circuit 302 may lock operation of main fans 312 (or power supply fans 314) to cause the fans to operate at a continuous speed level, or unlock the operation of the fans to allow the fans to change between speed levels.

In one embodiment, logic circuit 302 determines whether to make a cooling adjustment in response to temperature telemetry data detected by temperature sensors 316. In one embodiment, the temperature telemetry data is converted from analog temperature signals to digital temperature signals by one or more analog-to-digital converters (ADC) 318. Logic circuit 302 and ADC 318 are in communication to provide the digital temperature signals to logic circuit 302. In one embodiment, logic circuit 302 evaluates the digital temperature signals to determine whether to make a cooling adjustment to a cooling mechanism (such as a P-state controller 306, main fan 312, or power supply fan 314). In one embodiment, logic circuit 302 unlocks operation of the cooling mechanism during a turn associated with the cooling mechanism, and makes the cooling adjustment.

In one embodiment, enterprise server 300 includes a service processor module 320 configured to manage a workload on enterprise server 300 and to monitor operations of enterprise server 300. In one embodiment, service processor module 320 includes a service processor (SP) 322 (or baseboard management controller (BMC)), memory 324, storage 326, I/O components 328, and server management logic 332 (such as the Oracle integrated lights out manager (ILOM) and intelligent platform management interface (IPMI) firmware/software). In one embodiment, storage 326 includes a telemetry archive 330. In one embodiment, telemetry archive 330 includes a real-time circular file for collecting incoming time-series telemetry signals in real time and a lifetime history file, to which compressed records of the real time file are transferred when the real-time circular file is full. In one embodiment, service processor module 320 is computing device similar to computing device 605 (shown in FIG. 6) that is integrated with enterprise server 300. In one embodiment, service processor module 320 is specially configured with sensors and software to monitor the physical state of enterprise server 300. In one embodiment, service processor module 320 is configured to communicate with an administration network through network devices and included in I/O components 328. Management logic 332 includes logic for unified control of cooling in computers with multiple otherwise independent cooling systems (also referred to herein as unified thermal control logic 304) such as the methods shown and described herein, among other logic.

Enterprise server 300 includes main processors 334, main memory 336, main I/O components 338. In one embodiment, enterprise server 300 is a computing device similar to computing device 605 (shown in FIG. 6), although specially adapted to execute heavy workloads.

In one embodiment, enterprise server 300 includes power-based cooling controllers such as a DVFS power management performance state (P-state) controller 306. For example, main processors 334 may include a DVFS P-state controller 306 for throttling, scaling or capping the frequency and voltage at which main processors 334 run (thereby reducing temperature). A P-state is one of a set of a discrete levels of frequency and voltage less than or equal to the maximum frequency and voltage consumption of main processor 334, and distributed across the range of frequencies and voltages between minimum and maximum available to main processor 334.

DVFS P-state controller 306 is an example of a power-based cooling system. In a power-based cooling system, power consumption of a heat-generating computer component is adjusted by changing operating parameters or settings of the computer component. For example, the change to operating parameters or settings may include reducing frequency, voltage, and/or speed of a processor or other component to reduce the heat generated by the processor or other component. The procedures of adjusting operating parameters or settings of a component to reduce power consumption by the component may vary. In one embodiment, while systems and methods described herein refer to DVFS P-state control systems herein as an example, other power-based cooling systems may be substituted where DVFS P-state control is described. Also, in one embodiment, reference to processor-based cooling mechanisms herein are provided as an example of power-based cooling systems, and other power-based cooling systems may be substituted where processor-based cooling mechanisms are described. In one embodiment, unified thermal control logic 304 is configured to control adjustment of operating parameters of power-based cooling systems in order to control power consumption of a heat-generating computer component.

In one embodiment, the processor-based cooling mechanism may be a Dynamic Voltage and Frequency Scaling (DVFS) controller that adjusts operating parameters of a processor by dynamic voltage and/or frequency scaling. In another embodiment, the DVFS controller is configured to adjust the P-state of the processor to a lower level of power consumption. This in turn lowers the amount of heat generated by the processor and thus cools the processor since the processor temperature is lowered.

In one embodiment, P-state controller 306 can limit the processor to less than maximum performance by changing the P-state for main processor 334, for example in response to excessive heat. In one embodiment, as a P-State is adjusted upward, increasing the restriction on processor frequency and voltage, the instruction-processing frequency is adjusted downward, instantly (that is, within microseconds) lowering the thermal dissipation for the processor. This avoids triggering a thermal runaway event from exponential acceleration of leakage power in the processor. In one embodiment, P-state controllers 306 each implement P-state feedback control algorithms that determine when to shift main processor 334 operation between P-states. Main memory modules 336, main I/O components 338, cache memory (not shown), and other components may also have a DVFS/P-state or other power management system configured to scale or cap the frequency and voltage of their operation.

In one embodiment, power-based cooling systems cool components by reducing power consumed by the component by adjusting one or more operational parameters or settings that affect the operation of the component. The reduced power consumption resulting from the adjustments lowers the amount of heat generated by the component and thus cools the component, since the component temperature is lowered. Thus, in one embodiment, power-based cooling systems may include control systems that adjust a parameter or setting to reduce power consumed by a component. In one embodiment, power-based cooling systems may include control systems that adjust an operational parameter or setting to cause a component to produce less heat and thereby cooling the component.

In one embodiment, another power-based cooling system that may be controlled by unified thermal control logic 304 includes adjustments to power states (such as DVFS C-states) that allow for one or more blocks (or circuits or modules) of a processor or other component to be turned off or powered off. A power state controller that is configured to control power consumed by blocks of a component may adjust an operational parameter of the component to turn off a module to reduce or stop power consumption by that module. Heat produced by the component is thereby reduced, and the component is cooled because component temperature is lowered.

In one embodiment, another power-based cooling system that may be controlled by unified thermal control logic 304 includes a power gating controller that operates to shut off power to blocks (or circuits or modules) of a processor or other component. A power gating controller that is configured to control provision of power to a component may adjust an operational parameter to not supply power to blocks of the processor that are not in use, that have completed an operation, or that are in danger of overheating. Heat produced by the component is thereby reduced, and the component is cooled because component temperature is lowered.

In one embodiment, another power-based cooling system that may be controlled by unified thermal control logic 304 includes adjustments to clock speed of a processor or other component that allow fewer operations to be performed in a given time period by the component. A clock speed controller that is configured to control a rate of processor and/or other component cycles may adjust an operational parameter of a clock to reduce the clock rate or number of cycles per time period. Heat produced by the component is thereby reduced, and the component is cooled because component temperature is lowered.

In one embodiment, another power-based cooling system that may be controlled by unified thermal control logic 304 includes adjustments to sleep state of a processor or other components. A sleep state controller that is configured to control entry into and exit out of a sleep state for one or more components may adjust an operational parameter of a component to place the component into a sleep state. In the sleep state, the component is in a low-power, suspended operation status in which the component consumes little to no power. Heat produced by the component is thereby reduced, and the component is cooled because component temperature is lowered.

In one embodiment, another power-based cooling system that may be controlled by unified thermal control logic 304 includes adjustment to a global system state of a computer. A global system state controller that is configured to control an overall operational state of the computer and its components may adjust an operational parameter of the computer to move the computer from a working state to a sleep state (in which computer operations are suspended), or into a "soft" off state or shutdown (in which computer operations are terminated). In the sleep or shutdown states, components consume little to no power. Heat produced by the components is thereby reduced, and the components are cooled because component temperature is lowered.

In one embodiment, one or more components of enterprise server generate telemetry data regarding their current operational state. Such telemetry data may include, for example, power management state (such as P-state), load or utilization percentage, and power consumption level. Main processors 334, main memory 336 modules, main I/O components 338, ADC(s) 318, and fan controller 308 are each communicatively coupled to a peripheral bus 310 (such as an I²C bus, system management bus, power management bus, or intelligent platform management bus), and transmit the telemetry data through bus 310 to service processor 322 (or baseboard management controller).

Telemetry data may also include current operating temperature of enterprise server components. Temperature sensors 316 are configured to sense temperature of or intensity of heat in components. Temperature sensors 316 are positioned in contact with or proximate to main processors 334, main memory 336 modules, and main I/O components 338, among other locations within enterprise server 300. The positions of temperature sensors are such that they can measure operating temperatures (also referred to as the junction temperature, $T_j$) of main processors 334, main memory 336 modules, main I/O components 338, and other locations within enterprise server 300. Analog, transduced signals from temperature sensors 316 are provided to one or more analog-to-digital converters (ADC) 318, which generates digital telemetry data representing the analog temperature signals, for example as one or more junction temperature observation streams.

In one embodiment, the temperature telemetry is transmitted though the peripheral bus 310 to service processor module 320 for monitoring, recording, and/or analysis. In one embodiment, the temperature telemetry is also provided directly to a field programmable gate array (FPGA), application-specific integrated circuit (ASIC), or other logic circuit 302. Logic circuit 302 is configured (such as by logic 304) to achieve very low-latency control actuation for Dynamic Voltage and Frequency Scaling (DVFS), implemented through P-state controllers 306 for the CPUs. In one embodiment, logic circuit 302 is a system on a chip including a processor, memory, storage, and other components similar to those of computing device 605 shown and described with respect to FIG. 6. In one embodiment, logic circuit 302 is a FPGA having programmable logic blocks and memory elements configured to execute functions of methods shown and described herein. In one embodiment, Management logic 332 of service processor module 320 programs logic circuit 302 with unified thermal control logic 304.

In one embodiment, logic circuit 302 is connected through a high-speed (that is, having low latency compared to bus 310) interface 305—such as a synchronous serial interface (SSI)—to P-state controller 306 to enable logic circuit 302 to rapidly (within milliseconds) adjust or otherwise control processor voltage or frequency throttling (P-State). In one embodiment, interface 305 is a dedicated, direct communication channel between logic circuit 302 and processors 334 (including DVFS P-state controller 306).

In one embodiment, a processor, memory, and non-transitory computer-readable medium are packaged together in logic circuit 302. Thus, in one embodiment, a computer-readable medium included in a logic circuit is configured to execute computer-executable instructions implementing prioritized, turn-based control of multiple thermal management systems in computers, and also configured to adjust a P-state through a high-speed interface. In one embodiment, logic circuit 302 is connected through bus 310 to other control circuits, such as fan controllers 308, and to service processor module 320. Thus, in one embodiment, a computer-readable medium included in a logic circuit is configured to adjust a power level or rotation speed of a fan.

Enterprise server 300 includes fluid-based cooling controller(s), such as fan controller(s) 308, which is configured to manage (by increasing, decreasing, or maintaining) the speed of cooling fans (or main fans) 312 and power supply cooling fans 314, for example in response to commands generated by a feedback control loop. Fan controller 308 adjusts fan speeds by changing the amount of power provided to the fans, for example by pulse width modulation (PWM)—varying the average power delivered to the fans 312, 314 by repeatedly cutting out a portion of the power supplied. In one embodiment, fan controller 308 provides pulse width modulated power to the fans 312, 314 in order to adjust the speed of the fans. In one embodiment, fan controller 308 provides a PWM control signal to fans 312, 314, which then pulse width modulate their un-modulated power in accordance with the control signal in order to effect adjustment of the speed of the fans. In one embodiment, fans 312, 314 are individually addressable and therefore may each be operated at speeds distinct from speeds of other fans. Fan controller 308 generates telemetry data representing operational states (such as fan rotation speed) of fans 312 managed by fan controller 308. Unified thermal control logic 304 is configured to provide control actuation to fan controller 308 in order to control fan speeds.

Fan controller 308 and other fan-based cooling systems are an example of fluid-based cooling systems. In a fluid-based cooling system, a fluid such as a gas (e.g. air) or liquid is used to absorb heat from a component and move it away from the component. For example, a fan moves hot air from a hot location and replaces it with cooler air. The fluid or coolant medium of a fluid-based cooling system may vary. The structures for moving the fluid of a fluid-based cooling system may also vary. In one embodiment, while systems and methods described herein refer to fan-based cooling systems herein as an example, other fluid-based cooling systems may be substituted where fan-based cooling systems are described. In one embodiment, unified thermal control logic 304 is configured to provide control actuation to controllers of fluid-based cooling systems in order to control speed of delivery or circulation of a fluid. These fluid-based cooling systems may be controlled through fan controller 308 (for example by PWM power supply adjustment) or through other controllers (not shown) specific to the cooling system type, such as pumps that circulate a liquid coolant via tubes or other conduits.

For example, in addition to fan-based cooling systems, fluid-based cooling systems that may be controlled by unified thermal control logic 304 include liquid cooling systems. Liquid cooling systems may include water block cooling systems in which a liquid coolant such as one or more of water, alcohols, glycol, oil, hydrogen peroxide, or other liquids are moved through blocks adjacent to and/or in contact with computer components. The blocks absorb heat from the component and transfer it to the liquid, which is pumped away from the component and replaced with cooler liquid. Liquid cooling systems may also include liquid immersion, in which one or more computer components are submerged in a liquid, such as a non-conductive, dielectric liquid, that absorbs heat from the component, and is circulated to move the heated liquid away from the component and replace it with cooler liquid. Examples of dielectric liquids include various electrically insulating oils (for example mineral oil or silicone oil), purified water, or other various electrically insulating liquid compounds (for example, perfluorohexane, segregated hydrofluoroethers, and fluoroketones).

In one embodiment, fluid-based cooling systems may include phase change (refrigerant) chillers, which chill and remove heat from a fluid by phase change of a refrigerant fluid. Refrigerant chillers may use a refrigerant fluid to remove heat from components. Refrigerant chillers may also chill a secondary fluid, such as air or other gas circulated by fans (for example, as with an air conditioner), a liquid in a water block cooling system, or a liquid in a liquid immersion cooling system, in order pre-cool the fluid before it is passed across computer components to absorb heat from the components.

In one embodiment, fluid-based cooling systems may include Peltier effect (thermoelectric) chillers and other active cooling equipment. The thermoelectric chillers remove heat by absorbing the heat at electrified junctions of differing conductors. The heat-absorbing junctions may be placed adjacent to and/or in contact with computer components to absorb heat from the components when electric current is passed through the junctions. The heat-absorbing junctions may also chill a secondary fluid, as discussed above with reference to refrigerant chillers. The thermoelectric chillers are included as "fluid-based" cooling systems by analogy by conducting heat away by the flow of electric current.

In one embodiment, unified thermal control logic 304 is configured to exercise single control over multiple otherwise independent thermal management control systems, such as DVFS P-states controllers 306 (an example of power-based cooling), cooling fans 312, and power supply fans 314 (examples of fluid-based cooling), as shown and described in further detail herein. In one embodiment, unified control of independent thermal management systems, as shown and described herein, may mitigate or prevent thermal management system oscillations, the attendant temperature oscillations, and the associated negative effects on the enterprise server.

—Example Method—

Figure 4:
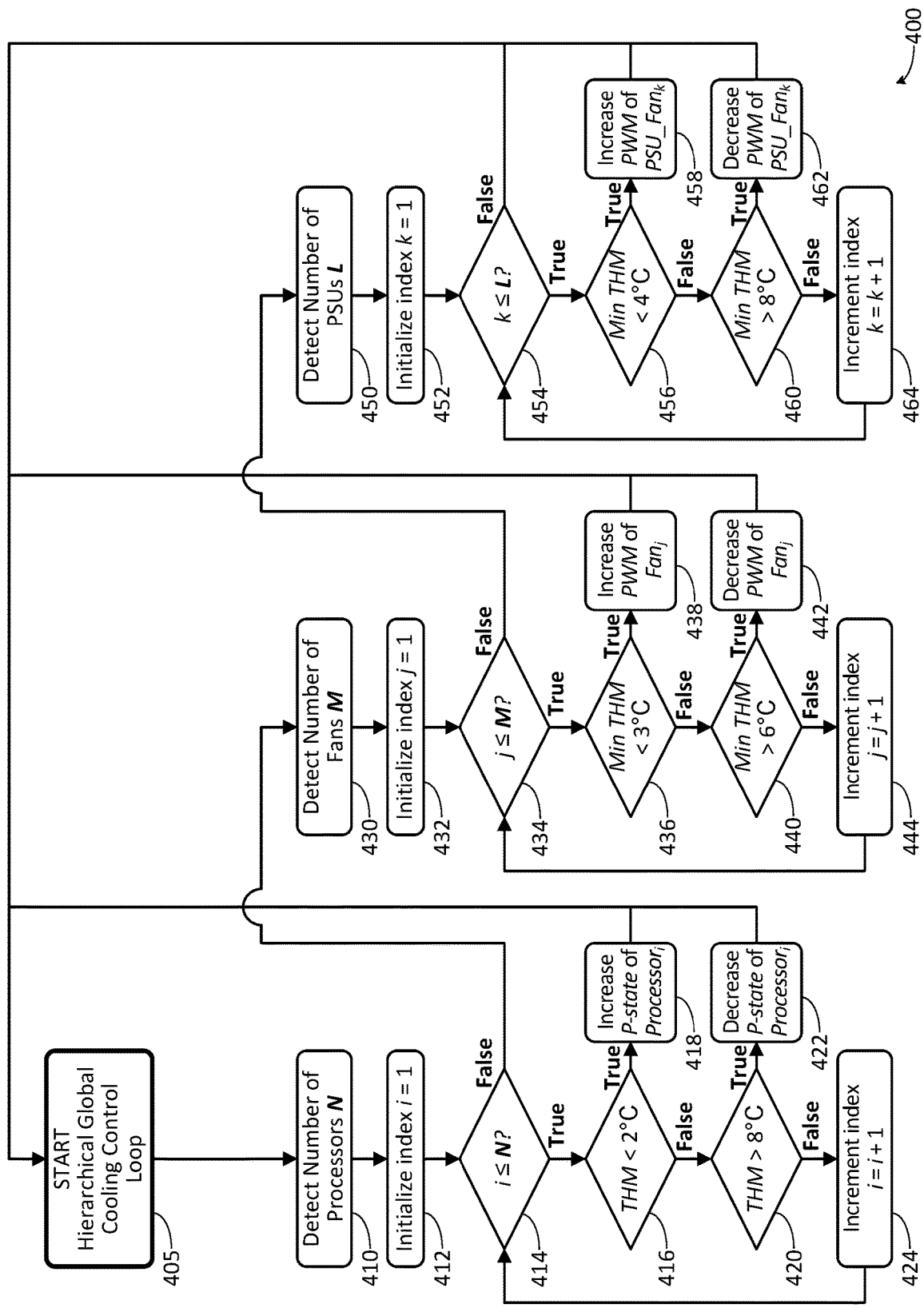
FIG. 4 illustrates one embodiment of a method for a hierarchical global cooling control loop associated with unified control of cooling in computers with multiple otherwise independent cooling systems.

FIG. 4 illustrates one embodiment of a method 400 for a hierarchical global cooling control loop associated with unified control of cooling in computers with multiple otherwise independent cooling systems. As an overview, in one embodiment, the method 400 evaluates whether to make a cooling adjustment to a cooling mechanism for cooling mechanisms at three separate priority levels. Processor-based cooling mechanisms are given a higher priority, fan-based cooling mechanisms are given a middle priority, and power-supply-fan-based cooling mechanisms are given a lower priority. Cooling adjustments are evaluated for cooling mechanisms in turn through a sequence or series of turns. The series of turns includes a series of turns for the high priority level processor-based cooling mechanisms, the middle priority level fan-based cooling mechanisms, and the lower priority power-supply-fan-based cooling mechanisms.

In one embodiment, steps of method 400 are performed by one or more modules of unified thermal control logic 304, by ADC 318, logic circuit 302, P-state controller 306, and fan controllers 308. In one embodiment, unified thermal control logic 304 configures enterprise server 300, service processor module 320, logic circuit 302, or computing device 605 to be a special purpose computing device or modules of a special purpose computing device that performs steps of method 400. In one embodiment, real time control over and management of multiple thermal management systems so as to prevent competition oscillations between the thermal management systems is enabled by the steps of method 400 due at least in part to the prioritized, turn-based nature of the control, where such real-time prevention of oscillations was not previously possible to be performed by computing devices. In one embodiment, unified thermal control over multiple otherwise independent thermal management systems is exercised in accordance with method 400.

The method 400 may be initiated automatically based on various triggers, such as in response to receiving a signal over a network or parsing stored data indicating that (i) a user (or administrator) of enterprise server 300 has initiated method 400, (ii) that method 400 is scheduled to be initiated at defined times or time intervals, (iii) that enterprise server 300 has commenced operating or is continuing to operate, or (iv) that enterprise server 300 is powered on and completes its boot-up process. The method 400 initiates at START Hierarchical Global Cooling Control Loop block 405 in response to parsing a signal received or stored data retrieved and determining that the signal or stored data indicates that the method 400 should begin. Processing continues to process block 410.

—Example Method—First Loop for Fastest-Acting Feedback/Control Effect—

In one embodiment, the processor exercises control over a first-priority thermal management system, in this case DVFS/P-state thermal control. Thus, in one embodiment, the first priority thermal management system includes dynamic voltage and frequency scaling configured to adjust a P-state of a component of the computer.

At process block 410, the processor detects a number of processors N in enterprise server 300. In one embodiment, N includes those processors (or other components) for which DVFS/P-state thermal control is available. In one embodiment, N is a stored constant value, and the processor retrieves and the value of N from storage. In one embodiment, the processor counts those processors (or other components) for which DVFS/P-state thermal control is available. The processor records identifiers for those processors (or other components) for which DVFS/P-state thermal control is available. In one embodiment, counting of the N processors is performed in an initial iteration of method 400 and stored, and is retrieved in subsequent iterations of method 400. Process block 410 completes, and processing continues to process block 412.

At process block 412, the processor initializes an index or counter i to be equal to 1. Process block 412 initiates a first loop for controlling P-states of the identified processors (or other components) for which DVFS/P-state thermal control is available. Processing at process block 412 completes and processing continues at decision block 414. The loop will iterate from i=1 to i=N, performing operations for each of the N processors (or other components) for which DVFS/P-state thermal control is available. In one embodiment, the N processors may include CPUs, graphics processing units (GPUs), northbridge (or memory controller hub). In one embodiment, each core of a multi-core processor may be considered as an individual processor, especially where the processor core has individual DVFS/P-state thermal control or individual thermal sensors. At process block 414, the processor retrieves the values of i and N. The processor compares the current value of i to N. The processor determines whether the current value of i is less than or equal to the value of N. Where i is not larger than N, (Block 414: True) there is still a processor, Processor$_i$ for which thermal state (that is, its current operating temperature or junction temperature) should be checked for need of P-state adjustment before considering adjustments to fans. Therefore, where i is less than or equal to N, (Block 414: True), processing at decision block 414 completes, and processing continues to decision block 416.

At process block 416, the processor determines if the thermal headroom margin (THM) is less than a pre-specified minimum margin (in one embodiment, the pre-specified minimum margin is 2° C.). Thermal headroom margin, as used herein, refers to the difference between a critical temperature above which a processor (or other component) should not be operated and a current (observed) operating temperature of the processor. Overheating of processors and other transistor-based components presents the danger of thermal runaway, where increased temperature allows greater current to flow through the component, further heating the component in an uncontrolled positive feedback cycle until the component is destroyed. The critical temperature is selected to be below a temperature that presents an unacceptable risk of thermal runaway or other damage to the component. The critical temperature of various components may be pre-defined by the component manufacturer or an administrator of the system and stored for reference. In one embodiment, reaching a critical temperature of a processor triggers an immediate emergency shutdown of the enterprise server.

In one embodiment, to determine if the THM is less than the minimum margin, the processor retrieves the critical temperature for Processor$_i$ and the current operating temperature for Processor$_i$. The processor calculates the difference between the critical temperature and the current operating temperature to find the current THM for Processor$_i$. The processor retrieves the minimum margin. The processor compares the values of the current THM for Processor$_i$ and minimum margin. The processor determines whether the current THM is less than the minimum margin. Where the THM is less than the minimum margin (Block 416: True), Processor$_i$ is coming close to overheating. Therefore, where the THM is less than the minimum margin (Block 416: True), processing at decision block 416 completes and processing continues at process block 418, where the P-state of Processor$_i$ is increased in order to throttle down Processor$_i$. Where the THM is not less than the minimum margin (Block 416: False), Processor$_i$, is not near to overheating. Therefore, where the THM is not less than the minimum margin (Block 416: False), processing at decision block 416 completes and processing continues at decision block 420, where the THM is evaluated for overcooling.

At process block 418, the processor increases the P-state of Processor$_i$. In one embodiment, the processor retrieves the current P-state of Processor$_i$. The processor then sets a new P-state for Processor$_i$ of current P-state+1. In one embodiment, the processor transmits this command to the P-state controller 306 of Processor$_i$. This further restricts the speed of Processor$_i$, allowing Processor$_i$ the opportunity to cool down. Processing at process block 418 then completes, and processing returns to START block 405, from which method 400 repeats.

At process block 420, the processor determines if the THM is greater than a pre-specified maximum margin (in one embodiment, the pre-specified maximum margin is 8° C.). In one embodiment, the processor retrieves the critical temperature for Processor$_i$ and the current operating temperature for Processor$_i$. The processor calculates the difference between the critical temperature and the current operating temperature to find the current THM for Processor$_i$. The processor retrieves the maximum margin. The processor compares the values of the current THM for Processor$_i$ and maximum margin. The processor determines whether the current THM is greater than the maximum margin. Where the THM is greater than the maximum margin (Block 420: True), Processor$_i$ is overcooled, and thus wasting energy. Therefore, where the THM is greater than the maximum margin (Block 420: True), processing at decision block 420 completes and processing continues at process block 422, where the P-state of Processor$_i$ is decreased in order to throttle up Processor$_i$. Where the THM is not greater than the maximum margin (Block 420: False), Processor$_i$ is not overcooled. Therefore, where the THM is not less than the minimum margin (Block 420: false), processing at decision block 420 completes and processing continues at process block 424.

At process block 422, the processor decreases the P-state of Processor$_i$. In one embodiment, the processor retrieves the current P-state of Processor$_i$. The processor then sets a new P-state for Processor$_i$ of current P-state−1. In one embodiment, the processor transmits this command to the P-state controller 306 of Processor$_i$. This reduces the restriction on the speed of Processor$_i$, allowing Processor$_i$ to perform operations more quickly. Processing at process block 422 then completes, and processing returns to START block 405, from which method 400 repeats.

Thus, in one embodiment, the processor executes instructions for controlling that include selecting from increasing, decreasing, and maintaining (at a same level) a thermal control state (such as a P-state or fan power level/speed). In one embodiment, as discussed with reference to blocks 416-422, the processor determines a margin of thermal headroom between an operating temperature of a component of the computer sensed by a temperature sensor and a critical temperature beyond which the component of the computer is not to be operated. The processor then compares the margin of thermal headroom to one of (i) a smaller threshold indicating that the thermal control state should be increased and (ii) a larger threshold indicating that the thermal control state should be reduced. Then, (i) where the margin of thermal headroom is less than the smaller threshold, the processor increases the thermal control state, (ii) where the margin of thermal headroom is greater than the larger threshold, the processor reduces the thermal control state, and (iii) where the margin of thermal headroom does not satisfy the smaller or larger threshold, the processor maintains the thermal control state at its current level. In response to (i) an increase of the thermal control state or reduction of the thermal control state, the processor returns to an initial turn (for example, at the beginning of the hierarchical global cooling control loop 405) of control of the first thermal adjustment components; and in response to (ii) maintenance of the thermal control state, the processor proceeds to a subsequent turn of control (for example by incrementing the index).

At process block 424, the processor increments index i upward by one (i=i+1). In one embodiment, the processor retrieves the value of i, adds one to it, and stores the resulting value as a new value of i. Processing at process block 424 then completes, and processing returns to decision block 414 to determine whether the first loop repeats for another processor.

Returning to decision block 414, where i is larger than N, (Block 414: False), the first loop has repeated for all N processors, and there are no processors remaining for which thermal state should be checked before adjustment to fan speeds is evaluated. Therefore, where i is greater than N, (Block 414: False), the first loop terminates, processing at decision block 414 completes, and processing continues to process block 430.

Thus, in one embodiment, the processor controls one or more first thermal adjustment components of a first-priority thermal management system having a first speed of thermal response, wherein the individual first thermal adjustment components are controlled during first asynchronous turns.

—Example Method—Second Priority Loop for Mid-Speed Feedback/Control Effect—

In one embodiment, the processor exercises control over a second-priority thermal management system, in this case main fans. Thus, in one embodiment, the second-priority thermal management system includes a fan controller configured to adjust a power level of a fan that cools one or more components of the computer.

At process block 430, the processor detects a number of main fans M in enterprise server 300. In one embodiment, main fans M includes those fans (or other cooling devices) for which fan speed (power) adjustment (or other cooling power adjustment) is available. In one embodiment, M is a stored constant value, and the processor retrieves and the value of M from storage. In one embodiment, M is stored in fan controller(s) 308 or system configuration files, or derivable from information stored in fan controller(s) 308 or system configuration files, such as a list of fans or fan IDs. In one embodiment, the processor counts those fans (or other cooling devices) that provide adjustable cooling. The processor records identifiers for those fans (or other components) for which power adjustment (and resulting adjustment to cooling intensity) is available. In one embodiment, counting of the M fans is performed in an initial iteration of method 400 and stored, and is retrieved in subsequent iterations of method 400. Process block 430 completes, and processing continues to process block 432.

At process block 432, the processor initializes an index or counter j to be equal to 1. Process block 432 initiates a second loop for controlling speeds of main fans (or other cooling devices) for which fan speed control (or more generally, cooling power control) is available. Processing at process block 432 completes and processing continues at decision block 434. The loop will iterate from j=1 to j=M, performing operations for each of the M fans (or other cooling devices) for which cooling power control is available. At process block 434, the processor retrieves the values of j and M. The processor compares the current value of j to M. The processor determines whether the current value of j is less than or equal to the value of M. Where j is not larger than M, (Block 434: True) there is still a fan (or cooling device), $Fan_j$ for which cooling power level should be checked for need of adjustment before considering adjustments to power supply fans. Therefore, where j is less than or equal to M, (Block 434: True), processing at decision block 434 completes, and processing continues to decision block 436.

At process block 436, the processor determines if the minimum thermal headroom margin (Min THM) is less than a pre-specified lower margin (in one embodiment, the pre-specified lower margin is 3° C.). In one embodiment, a fan may be tasked with cooling multiple components, or otherwise associated with cooling multiple components. In one embodiment, the multiple components may include the N processors. In one embodiment, the multiple components may also include other components of the enterprise server, such as graphics cards, memory modules, hard drive disks, network cards, fan motors, or cooling zones within the chassis of the enterprise server. In one embodiment, one or more fans may be associated with cooling a component or zone. A fan may be associated with a component by being configured to cool the component, for example a cooling fan affixed to a heat sink of a processor is associated with the processor. A fan may be associated with a zone or other region within the enterprise server by being configured to cool the zone, for example a fan directing airflow through one of several parallel cooling zones is associated with the one cooling zone. The fan affixed to the processor may also have a cooling effect on nearby components or a zone surrounding the processor, and thereby also be associated with the nearby components or zone. (For convenience, components and zones may be referred to collectively herein as components.) A record of the association of the fan with a component or zone may be stored in and retrieved from system configuration files or other data structures. Each of these components or zones may have one or more temperature sensors configured to detect current operating temperature in the component or zone. Each of these components or zones may have their own current thermal headroom value between a critical temperature above which the component should not be operated and the current (or most recently observed) operating temperature of the component. A fan (or other cooling device) associated with cooling one or more components or zones should increase cooling power when thermal headroom of any of the components or zones is below a lower margin, and decrease cooling power when thermal headroom of all these components or zones is above a higher margin.

Therefore, in one embodiment, to determine whether the minimum thermal headroom margin is less than the lower margin for a fan $Fan_j$, the processor first determines the current thermal headroom values of components or zones associated with (that is, cooled at least in part by) fan $Fan_j$. For example, the processor retrieves readings from temperature sensors in or on the components or zones associated with the fan $Fan_j$, retrieves pre-determined critical temperatures for the components or zones, and finds the mathematical difference between the current (or most recently observed) temperature for the component or zone and a critical temperature for the component or zone. The processor compares the current thermal headroom values for the components or zones associated with $Fan_j$ and identifies the minimum thermal headroom margin (Min THM) among the values. Thus, minimum thermal headroom margin, as used herein, refers to the smallest thermal headroom margin among thermal headroom margins for a set of components cooled (or considered to be cooled) at least in part by a cooling device such as a main fan or power supply unit (PSU) fan. Thus, in one embodiment, the processor selects as the margin of thermal headroom a least margin of thermal headroom in a set of margins of thermal headroom for a set of components of the computer that are cooled by one of the second thermal adjustment components.

The processor then retrieves the pre-specified lower margin. The processor compares the values of lower margin and Min THM for $Fan_j$. The processor determines whether the current Min THM is less than the lower margin. Where the Min THM is less than the minimum margin (Block 436: True), $Fan_j$ is undercooling an associated component or zone, and more cooling is justified for the component or zone associated with $Fan_j$. Therefore, where the Min THM is less than the minimum margin (Block 436: True), processing at decision block 436 completes and processing continues at process block 438, in which the PWM power delivery to $Fan_j$ is increased in order to further cool the component or zone associated with $Fan_j$. Where the Min THM is not less than the minimum margin (Block 436: False), additional cooling by $Fan_j$ is not needed. Therefore, where the Min THM is not less than the minimum margin (Block 436: False), processing at decision block 436 completes and processing continues at decision block 440, where the Min THM is evaluated for overcooling.

In one embodiment, the fans (and PSU fans) are operated at one of a contiguous set of PWM power levels between off (no power) and maximum (full power). At process block 438, the processor increases the PWM power delivered to $Fan_j$. In one embodiment, the processor retrieves the current power level of $Fan_j$. The processor then sets a new power level for $Fan_j$ of current power level+1. In one embodiment, the processor transmits a command to set the new power level to the fan controllers 308 (for example, through bus 310) in order to effect the increase in power delivered to $Fan_j$. This increase in PWM power increases the fan speed of $Fan_j$, further cooling the component or zone associated with $Fan_j$. Processing at process block 438 then completes, and processing returns to START block 405, from which method 400 repeats.

At process block 440, the processor determines if the minimum thermal headroom margin (Min THM) is greater than a pre-specified higher margin (in one embodiment, the pre-specified higher margin is 6° C.). In one embodiment, the processor retrieves (or determines again, if necessary) the current minimum thermal headroom margin for the components or cooling zones associated with $Fan_j$ and also retrieves the pre-specified higher margin. The processor compares the values of the current Min THM for $Fan_j$ and higher margin. The processor determines whether the current Min THM is greater than the higher margin. Where the Min THM is greater than the higher margin (Block 440: True), $Fan_j$ is overcooling its associated components or zones, and thus wasting energy. Therefore, where the Min THM is greater than the higher margin (Block 440: True), processing at decision block 440 completes and processing continues at process block 442, in which the PWM power delivery to $Fan_j$ is decreased in order to reduce cooling of the component or zone associated with $Fan_j$. Where the Min THM is not greater than the higher margin (Block 440: False), $Fan_j$ is not overcooling its associated component or zone. Therefore, where the Min THM is not less than the minimum margin (Block 440: False), processing at decision block 440 completes and processing continues at process block 444.

At process block 442, the processor decreases the PWM power delivered to $Fan_j$. In one embodiment, the processor retrieves the current power level of $Fan_j$. The processor then sets a new power level for $Fan_j$ of current power level−1. In one embodiment, the processor transmits a command to set the new power level to the fan controllers 308 (for example, through bus 310) in order to effect the reduction in power delivered to $Fan_j$. This decrease in PWM power reduces the fan speed of $Fan_j$, reducing the cooling the component or zone associated with $Fan_j$, and allowing the component or zone associated with $Fan_j$ to warm. Processing at process block 442 then completes, and processing returns to START block 405, from which method 400 repeats.

At process block 444, the processor increments index j upward by one (j=j+1). Note that, in the event of any adjustment to main fans (at process blocks 438 or 442), method 400 immediately returns to evaluate the effect of the adjustment on the thermal state of the processors. Thus, further adjustment to main fans is contingent on lack of need of adjustment in the N processors. Fans with higher indexes are reached when the N processors and fans with lower indexes do not need adjustment. In one embodiment, the processor retrieves the value of j, adds one to it, and stores the resulting value as a new value of j. Processing at process block 444 then completes, and processing returns to decision block 434 to determine whether the second loop repeats for another fan.

Returning to decision block 434, where j is larger than M, (Block 434: False), the second loop has repeated for all M fans, and there are no further fans for which cooling power level should be checked for need of adjustment before considering adjustments to power supply fans. Therefore, where j is greater than M, (Block 434: False), the second loop terminates, processing at decision block 434 completes, and processing continues to process block 450.

Thus, in one embodiment, following completion of the first asynchronous turns, control one or more second thermal adjustment components of a second-priority thermal management system having a second speed of thermal response that is slower than the first speed, wherein the individual second thermal adjustment components are controlled during second asynchronous turns. —Example Method—Third Priority Loop for Low-Speed Feedback/Control Effect—

In one embodiment, the processor exercises control over a third-priority thermal management system, in this case PSU fans. Thus, in one embodiment, the second-priority thermal management system includes a fan controller configured to adjust a power level of a fan that cools one or more components of the computer.

At process block 450, the processor detects a number of power supply unit (PSU) fans L in enterprise server 300. In one embodiment, L includes those PSU fans for which fan speed (power) adjustment is available. In one embodiment, L is a stored constant value, and the processor retrieves and the value of L from storage. In one embodiment, L is stored in fan controller(s) 308 or system configuration files, or derivable from information stored in fan controller(s) 308 or system configuration files, such as a list of PSU fans or PSU fan IDs. In one embodiment, the processor counts those PSU fans that provide adjustable cooling. The processor records identifiers for those PSU fans for which power adjustment (and resulting adjustment to cooling intensity) is available. In one embodiment, counting of the L PSU fans is performed in an initial iteration of method 400 and stored, and is retrieved in subsequent iterations of method 400. Process block 450 completes, and processing continues to process block 452.

At process block 452, the processor initializes an index or counter k to be equal to 1. Process block 452 initiates a third loop for controlling speeds of PSU fans for which fan speed control is available. Processing at process block 452 completes and processing continues at decision block 454. The loop will iterate from k=1 to k=L, performing operations for each of the L PSU fans for which cooling power control is available. At process block 454, the processor retrieves the values of k and L. The processor compares the current value of k to L. The processor determines whether the current value of k is less than or equal to the value of L. Where k is not larger than L, (Block 454: True) there is still a PSU fan $PSU\_Fan_k$ for which cooling power level should be checked for need of adjustment. Therefore, where k is less than or equal to L, (Block 454: True), processing at decision block 454 completes, and processing continues to decision block 456.

At process block 456, the processor determines if a minimum thermal headroom margin (Min THM) across components or zones associated with PSU fans for cooling is less than a pre-specified lower margin (in one embodiment, the pre-specified lower margin is 4° C.). In one embodiment, in this lower (third) priority loop in the hierarchy, the minimum thermal headroom margin is larger than the minimum thermal headroom margin in the higher (second) priority loop. In one embodiment, a PSU fan may be associated with cooling of components or zones in addition to a PSU in/on which the PSU fan is installed, in a manner similar to that described above for fans. A record of association of a PSU Fan with various components or zones may be stored in and retrieved from system configuration files or other data structures. As with fans, a PSU fan should increase cooling power when thermal headroom of any of the components or zones with which the fan is tasked with cooling is below a lower margin, and decrease cooling power when thermal headroom of all these components or zones is above a higher margin.

Therefore, in one embodiment, to determine whether the minimum thermal headroom margin is less than the lower margin for a PSU fan $PSU\_Fan_k$, the processor first determines the current thermal headroom values of components or zones associated with (that is, cooled at least in part by) PSU fan $PSU\_Fan_k$, in a manner similar to that described above for fans. The processor compares the current thermal headroom values for the components or zones associated with $PSU\_Fan_k$ and identifies the minimum thermal headroom (Min THM) among the values. The processor then determines whether the current Min THM is less than the lower margin in a manner similar to that described above for fans, retrieving and comparing the values of current Min THM and the lower margin. Where the Min THM is less than the lower margin (Block 456: True), $PSU\_Fan_k$ may efficiently contribute more cooling to the component or zone with the minimum thermal headroom. Therefore, where the Min THM is less than the lower margin (Block 456: True), processing at decision block 456 completes and processing continues at process block 458, in which the PWM power delivery to $PSU\_Fan_k$ is increased in order to further cool the components or zones associated with $PSU\_Fan_k$. Where the Min THM is not less than the lower margin (Block 456: False), additional cooling by $Fan_j$ is not needed. Therefore, where the Min THM is not less than the lower margin (Block 456: False), processing at decision block 456 completes and processing continues at decision block 460, where the Min THM of $PSU\_Fan_k$ is evaluated for overcooling.

At process block 458, the processor increases the PWM power delivered to $PSU\_Fan_k$. In one embodiment, the processor retrieves the current power level of $PSU\_Fan_k$. The processor then sets a new power level for $PSU\_Fan_k$ of current power level+1. In one embodiment, the processor transmits a command to set the new power level to the fan controllers 308 (for example, through bus 310) in order to effect the increase in power delivered to $PSU\_Fan_k$. This increase in PWM power increases the fan speed of $PSU\_Fan_k$, further cooling the components or zones associated with $PSU\_Fan_k$. Processing at process block 458 then completes, and processing returns to START block 405, from which method 400 repeats.

At process block 460, in a manner similar to that described above for fans, the processor determines if minimum thermal headroom margin (Min THM) is greater than a pre-specified higher margin (in one embodiment, the pre-specified higher margin is 8° C.). In one embodiment, the processor retrieves (or determines again, if necessary) the current minimum thermal headroom margin for the components or cooling zones associated with $PSU\_Fan_k$ and also retrieves the pre-specified higher margin. The processor compares the values of the current Min THM for $PSU\_Fan_k$ and higher margin. The processor determines whether the current Min THM is greater than the higher margin. Where the Min THM is greater than the higher margin (Block 460: True), $PSU\_Fan_k$ is overcooling its associated component or zone, and thus wasting energy. Therefore, where the Min THM is greater than the higher margin (Block 460: True), processing at decision block 460 completes and processing continues at process block 462, in which the PWM power delivery to $PSU\_Fan_k$ is decreased in order to reduce cooling of the components or zones associated with $PSU\_Fan_k$. Where the Min THM is not greater than the higher margin (Block 460: False), $PSU\_Fan_k$ is not overcooling its associated components or zones. Therefore, where the Min THM is not less than the minimum margin (Block 460: False), processing at decision block 460 completes and processing continues at process block 464.

At process block 462, the processor decreases the PWM power delivered to $PSU\_Fan_k$. In one embodiment, the processor retrieves the current power level of $PSU\_Fan_k$. The processor then sets a new power level for $PSU\_Fan_k$ of current power level−1. In one embodiment, the processor transmits a command to set the new power level to the fan controllers 308 (for example, through bus 310) in order to effect the reduction in power delivered to $PSU\_Fan_k$. This decrease in PWM power reduces the fan speed of $PSU\_Fan_k$, reducing the cooling the component or zone associated with $PSU\_Fan_k$, and allowing the component or zone associated with $PSU\_Fan_k$ to warm. Processing at process block 462 then completes, and processing returns to START block 405, from which method 400 repeats.

At process block 464, the processor increments index k upward by one (k=k+1). Note that as with adjustment to main fans, in the event of any adjustment to PSU fans (at process blocks 458 or 462), method 400 immediately returns to evaluate the effect of the adjustment on the thermal state of the processors, and further on the main fans. In one embodiment, the processor retrieves the value of k, adds one to it, and stores the resulting value as a new value of k. Processing at process block 464 then completes, and processing returns to decision block 454 to determine whether the third loop repeats for another PSU fan.

Returning to decision block 464, where k is larger than L, (Block 464: False), the third loop has repeated for all L PSU fans, and there are no further PSU fans for which cooling power level should be checked for need of adjustment. Therefore, where k is greater than L, (Block 464: False), the third loop terminates, processing at decision block 464 completes, and processing returns to START block 405, from which method 400 repeats.

Thus, in one embodiment, following completion of the second asynchronous turns, the processor controls one or more PSU fans of a PSU fan system having a third speed of thermal response that is slower than the first speed and the second speed, wherein the individual PSU fans are controlled during third asynchronous turns.

In one embodiment, process blocks 418, 422, 438, 442, 458, and 462 are performed by local control algorithms, and permission for operation of the local control algorithms is managed by unified thermal control logic 304 to execute prioritized, turn-based control of multiple thermal management systems in enterprise server 300. Permission is granted by the unified thermal control logic for those local control algorithms to operate for an individual component (P-state, fan, or other cooling component) during execution at that process block, and permission is withheld by the unified thermal control logic and the local control algorithms are prevented from acting when the process block is not being executed. Therefore, the constraint against simultaneous controller action and turn-based, round-robin, sequential operation of individual, otherwise independent local control algorithms is enforced by unified thermal control logic. In one embodiment, the loops include dead zone or hysteresis analyses of the activity of the thermal adjustment components: where no adjustment is needed, none is allowed to be made by the unified thermal control logic; where adjustment calling for increased cooling is needed, the unified thermal control logic permits a cooling adjustment to be made; and where adjustment calling for decreased cooling is needed, the unified thermal control logic permits a warming adjustment to be made.

In one embodiment, additional priority levels may be included in method 400 as additional loops. These additional loops integrate further independent cooling or other thermal management systems into a hierarchical global cooling control loop such as that shown in method 400. In one embodiment, cooling systems are included in the loop in such a way that adjustments to the thermal management systems are evaluated in a hierarchy ranked by response time of the system to cause temperature adjustment. For example, in method 400, adjustments to P-state operate most rapidly, and can cause reduction in processor (or other component) temperature within microseconds. Adjustments to P-states are therefore evaluated at the top of the hierarchy. Adjustments to fans operate less rapidly, and can cause reduction in processor (or other component) temperature within a few seconds. Adjustments to fans are therefore evaluated following adjustments to P-states in the hierarchy. Adjustments to power supply fans can cause reduction in processor (or other component) temperature after many seconds. (Note that although they contribute some cooling to other computer system components, the primary purpose of power supply fans is to cool power supplies.) Adjustments to power supply fans are therefore evaluated following adjustment to P-states and adjustments to fans in the hierarchy.

In one embodiment, an additional loop might be inserted into the loop for other cooling systems, such as cooling systems (such as fans) for a rack, cabinet, or row that includes the enterprise server, or even cooling systems (such as air conditioning) for a computer room or data center that includes the enterprise server. Such additional loops are inserted into the hierarchical global cooling control loop in order of the rapidity of their effect on component temperature. In one embodiment, cooling systems with similar speeds of cooling response are grouped together for example, liquid cooling chillers may deliver a cooling response an order of magnitude faster than fans, and still be slower than DVFS/P-state throttling, and so may be inserted as an additional loop between processor P-state loop (blocks 410-424) following a "false" determination at decision block 414 and main fans loop (blocks 430-444). In another example, rack, cabinet, row, or computer room cooling systems, which have a cooling response slower than that delivered by PSU fans, may be inserted as an additional loop following PSU fan loop (blocks 450-464), following a "false" determination at decision block 454.

—Example Method—

Figure 5:
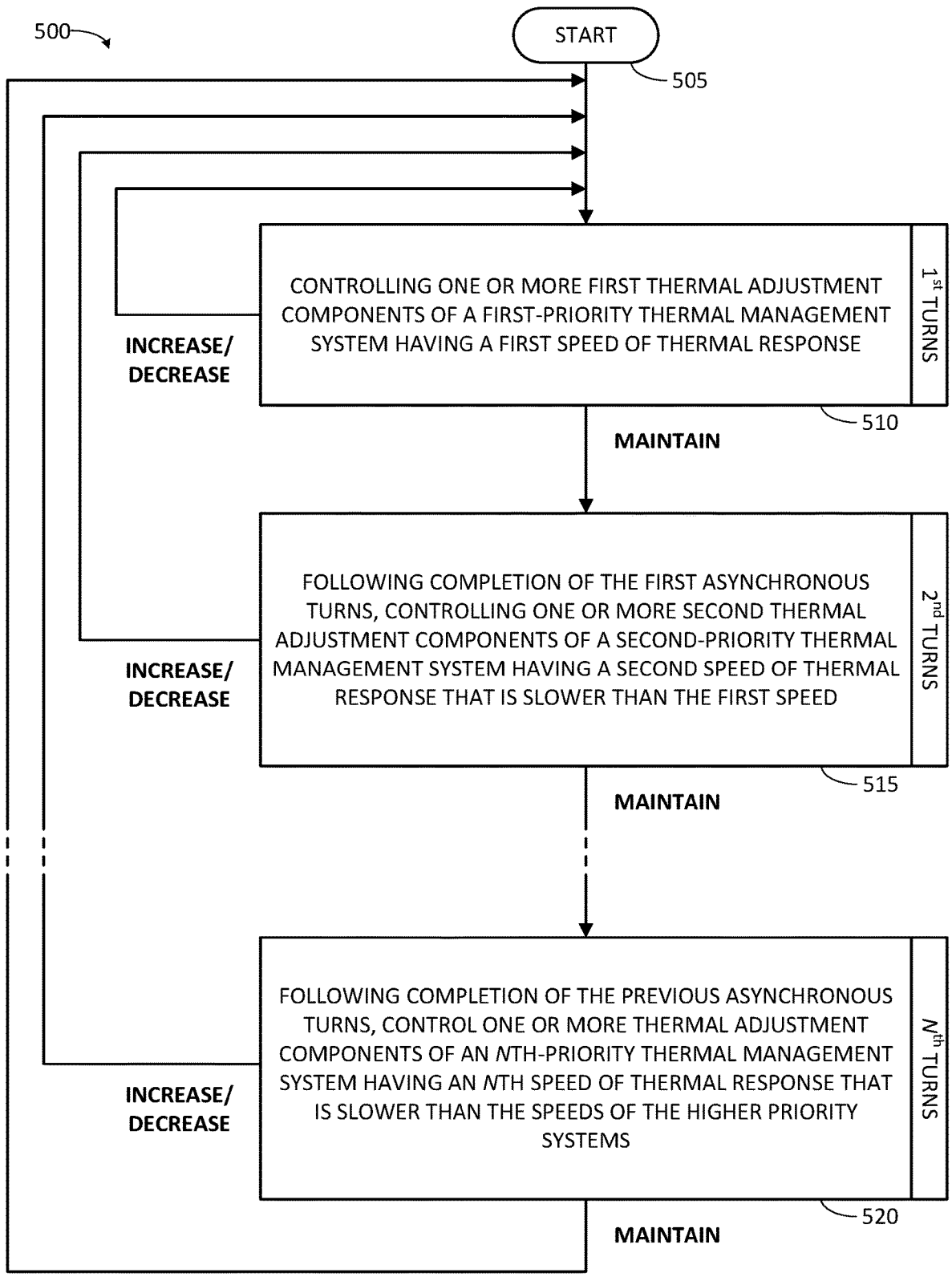
FIG. 5 illustrates one embodiment of a method associated with unified control of cooling in computers with multiple otherwise independent cooling systems.

FIG. 5 illustrates one embodiment of a method 500 associated with unified control of cooling in computers with multiple otherwise independent cooling systems. In one embodiment, unified cooling control that may mitigate, reduce or prevent oscillations the thermal management systems is enabled by the steps of method 500 due at least in part to the prioritized, turn-based nature of the control, where such real-time prevention of oscillations was not previously possible to be performed by computing devices. In one embodiment, unified thermal control over multiple otherwise independent thermal management systems is exercised in accordance with method 500.

The method 500 may be initiated automatically based on various triggers, such as in response to receiving a signal over a network or parsing stored data indicating that (i) a user (or administrator) of enterprise server 300 has initiated method 500, (ii) that method 500 is scheduled to be initiated at defined times or time intervals, (iii) that enterprise server 300 has commenced operating or is continuing to operate, or (iv) that enterprise server 300 is powered on. The method 500 initiates at START block 505 in response to parsing a signal received or stored data retrieved and determining that the signal or stored data indicates that the method 500 should begin. Processing continues to process block 510.

At process block 510, the processor controls one or more first thermal adjustment components of a first-priority thermal management system. The first-priority thermal management system has a first speed of thermal response. The individual first thermal adjustment components are controlled during first asynchronous turns. In one embodiment, the processor controls one or more first thermal adjustment components of a first-priority thermal management system as shown and described above with reference to process blocks 210-224 of method 200.

In one embodiment, the first thermal adjustment components are cooling components configured to reduce temperature of components of the enterprise server, such as a DVFS power management system configured to reduce component temperature by voltage or frequency throttling, and various fan cooling, liquid cooling, chiller systems, and other active cooling equipment configured to reduce component temperature by transferring heat away from the component. As used herein, the "speed of thermal response" or "speed of cooling response" of the thermal management system includes the time from detecting a need for a change in component temperature until the time that an instruction intended to cause the change begins to take effect in the component. For example, this speed of response includes communication latency (for example, of instructions through the I2C bus to fans) and thermal inertia of components. The speed of response in P-state adjustment is far shorter, including essentially only detection, processing time, and communication latency across a high speed interface to a processor.

In one embodiment, the individual first thermal adjustment components are controlled during first asynchronous turns. In one embodiment, the turns are asynchronous in that they are not simultaneous and do not occur at the same time. In one embodiment, the asynchronous turns do not overlap, such that control is exercised over only one thermal adjustment component (such as a cooling fan) at a time. In one embodiment, the asynchronous turns are sequential such that control is exercised over each thermal adjustment component in a particular order, for example in ascending alphabetical and/or numerical order of an identifier for the thermal adjustment component. In this way, the turns are round-robin turns, in which control is exercised over the thermal components in an order of a predetermined sequence.

Processing at process block 510 completes, and processing continues to process block 515. As discussed above with reference to process blocks 416-422, 436-442, and 456-262, where an increase or decrease of a thermal control state (for example, increase or decrease of a P-state or fan power level) is triggered in any turn, method 500 will start over again from the beginning following start block 505. Where the control simply maintains the thermal control state through every turn in a set of turns (associated with a priority level, such as the first turns associated with the first-priority thermal management system), control will pass through to turns for components managed by the next lower priority thermal management system.

Thus, at process block 515, following completion of the first asynchronous turns, the processor controls one or more second thermal adjustment components of a second-priority thermal management system, for example as shown and described above with reference to process blocks 430-444 or 450-462 of method 400. The second-priority thermal management system has a second speed of thermal response that is slower than the first speed. In one embodiment, the second-priority thermal management system has a speed of thermal response one or more orders of magnitude slower than that of the first-priority thermal management system. The individual second thermal adjustment components are controlled during second asynchronous turns. The second asynchronous turns are a block or set of turns that follow a prior block or set of the first asynchronous turns. Processing at process block 515 completes, and processing repeats indefinitely beginning at process block 510 while enterprise server 300 is active, and method 500 terminates when enterprise server 300 is shut down.

In one embodiment method 500 may be extended though a number N of additional thermal management systems, as shown at process block 520. Following completion of the previous asynchronous turns for the higher priority thermal management systems, the processor controls one or more Nth thermal adjustment components of an Nth-priority thermal management system. The Nth-priority thermal management system has an Nth speed of thermal response that is slower than the speeds of the higher priority systems. The individual Nth thermal adjustment components are controlled during Nth asynchronous turns.

—Selected Advantages—

The systems, methods, and other embodiments described herein for unified control of cooling in computers with multiple otherwise independent cooling systems may reduce or eliminate feedback control instability or oscillations in server thermal control. In one embodiment, therefore, the systems, methods, and other embodiments described herein may (i) reduce energy wastage that comes from oscillating fan speeds, (ii) reduce vibrations and the resulting increase in hard disk drive (HDD) seek time, (iii) reduce acoustic noise and the need for noise attenuation, and/or (iv) improve the long-term reliability for enterprise computing servers. The systems, methods, and other embodiments described herein may result in higher computational performance by reducing, mitigating, or eliminating P-state oscillations that can reduce computation speed by nearly 50% of the CPU's design capability. The systems, methods, and other embodiments described herein may result in higher computational performance by reducing fan-caused physical vibration that reduces HDD read/write speed performance. The systems, methods, and other embodiments described herein may prevent repeated rapid changes in temperature which accelerate multiple printed circuit board and interconnect degradation mechanisms that are harmful to electronic systems, thereby improving long-term system reliability.

—Computing Device Embodiment—

FIG. 600 illustrates an example computing system 600 that is configured and/or programmed as a special purpose computing device with one or more of the example systems and methods described herein, and/or equivalents. The example computing device may be a computer 605 that includes at least one hardware processor 610, a memory 615, and input/output ports 620 operably connected by a bus 625. In one example, the computer 605 may include unified thermal control logic 630 configured to facilitate prioritized, turn-based control of multiple thermal management systems in computers, similar to the logic, systems, and methods shown in and described with reference to FIGS. 1, 2, 3, 4, and 5.

In different examples, the logic 630 may be implemented in hardware, a non-transitory computer-readable medium 637 with stored instructions, firmware, and/or combinations thereof. While the logic 630 is illustrated as a hardware component attached to the bus 625, it is to be appreciated that in other embodiments, the logic 630 could be implemented in the processor 610, stored in memory 615, or stored in disk 635.

In one embodiment, logic 630 or the computer is a means (e.g., structure: hardware, non-transitory computer-readable medium, firmware) for performing the actions described. In some embodiments, the computing device may be a server operating in a cloud computing system, a server configured in a Software as a Service (SaaS) architecture, a smart phone, laptop, tablet computing device, and so on.

The means may be implemented, for example, as an ASIC or other logic circuit programmed to execute prioritized, turn-based control of multiple thermal management systems in computers. The means may also be implemented as stored computer executable instructions that are presented to computer 605 as data 640 that are temporarily stored in memory 615 and then executed by processor 610.

Logic 630 may also provide means (e.g., hardware, non-transitory computer-readable medium that stores executable instructions, firmware) for performing prioritized, turn-based control of multiple thermal management systems in computers.

Generally describing an example configuration of the computer 605, the processor 610 may be a variety of various processors including dual microprocessor and other multi-processor architectures. A memory 615 may include volatile memory and/or non-volatile memory. Non-volatile memory may include, for example, read-only memory (ROM), programmable ROM (PROM), and so on. Volatile memory may include, for example, random access memory (RAM), static RAM (SRAM), dynamic RAM (DRAM), and so on.

A storage disk 635 may be operably connected to the computer 605 via, for example, an input/output (I/O) interface (e.g., card, device) 645 and an input/output port 620 that are controlled by at least an input/output (I/O) controller 647. The disk 635 may be, for example, a magnetic disk drive, a solid state disk drive, a floppy disk drive, a tape drive, a Zip drive, a flash memory card, a memory stick, and so on. Furthermore, the disk 635 may be a compact disc (CD) ROM (CD-ROM) drive, a CD-recordable (CD-R) drive, a CD-rewritable (CD-RW) drive, a digital video disc (DVD) ROM, and so on. The memory 615 can store a process 650 and/or a data 640, for example. The disk 635 and/or the memory 615 can store an operating system that controls and allocates resources of the computer 605.

The computer 605 may interact with, control, and/or be controlled by input/output (I/O) devices via the input/output (I/O) controller 647, the I/O interfaces 645, and the input/output ports 620. Input/output devices may include, for example, one or more displays 670, printers 672 (such as inkjet, laser, or 3D printers), audio output devices 674 (such as speakers or headphones), text input devices 680 (such as keyboards), cursor control devices 682 for pointing and selection inputs (such as mice, trackballs, touch screens, joysticks, pointing sticks, electronic styluses, electronic pen tablets), audio input devices 684 (such as microphones or external audio players), video input devices 686 (such as video and still cameras, or external video players), image scanners 688, video cards (not shown), disks 635, network devices 620, and so on. The input/output ports 620 may include, for example, serial ports, parallel ports, and universal serial bus (USB) ports. In one embodiment, the computer 605 may be connected to temperature sensor 690 through I/O ports 620 and analog-to-digital converter ADC 695 in order to receive sensed temperature information about computing device temperatures. In one embodiment, the computer may be connected to temperature sensor 690 through ADC 695 through a service bus, such as an $I^2C$ bus.

The computer 605 can operate in a network environment and thus may be connected to the network devices 655 via the I/O interfaces 645, and/or the I/O ports 620. Through the network devices 655, the computer 605 may interact with a network 660. Through the network 660, the computer 605 may be logically connected to remote computers 665. Networks with which the computer 605 may interact include, but are not limited to, a local area network (LAN), a wide area network (WAN), and other networks.

—Software Module Embodiments—

In general, software instructions are designed to be executed by one or more suitably programmed processor accessing memory. These software instructions may include, for example, computer-executable code and source code that may be compiled into computer-executable code. These software instructions may also include instructions written in an interpreted programming language, such as a scripting language.

In a complex system, such instructions may be arranged into program modules with each such module performing a specific task, process, function, or operation. The entire set of modules may be controlled or coordinated in their operation by an operating system (OS) or other form of organizational platform.

In one embodiment, one or more of the components described herein are configured as modules stored in a non-transitory computer readable medium. The modules are configured with stored software instructions that when executed by at least a processor accessing memory or storage cause the computing device to perform the corresponding function(s) as described herein.

In one embodiment, modules and other components may intercommunicate by electronic messages or signals. These electronic messages or signals may be configured as calls to functions or procedures that access the features or data of the component or module, such as for example application programming interface (API) calls. Components or modules may (i) generate or compose an electronic message or signal to issue a command or request to another component or module, (ii) transmit the message or signal to other components using the infrastructure (such as busses or networking components of one or more computing devices) and (iii) parse the content of an electronic message or signal received to identify commands or requests that the component or module can perform, and in response to identifying the command, the component or module can automatically perform the command or request.

Definitions and Other Embodiments

In another embodiment, the described methods and/or their equivalents may be implemented with computer executable instructions. Thus, in one embodiment, a non-transitory computer readable/storage medium is configured with stored computer executable instructions of an algorithm/executable application that when executed by a machine(s) cause the machine(s) (and/or associated components) to perform the method. Example machines include but are not limited to a processor, a computer, a server operating in a cloud computing system, a server configured in a Software as a Service (SaaS) architecture, a smart phone, and so on). In one embodiment, a computing device is implemented with one or more executable algorithms that are configured to perform any of the disclosed methods.

In one or more embodiments, the disclosed methods or their equivalents are performed by either: computer hardware configured to perform the method; or computer instructions embodied in a module stored in a non-transitory computer-readable medium where the instructions are configured as an executable algorithm configured to perform the method when executed by at least a processor of a computing device.

In one embodiment, each step of computer-implemented methods described herein may be performed by a processor (such as logic circuit 302, service processor 322, or processor 610) of one or more computing devices (i) accessing memory (such as onboard memory of logic circuit 302, memory 324, memory 615) and (ii) configured with logic to cause the system to execute the step of the method (such as unified thermal control logic 304 or unified thermal control logic 630). For example, the processor accesses and reads from or writes to the memory and executes the logic to perform the steps of the computer-implemented methods described herein. These steps may include (i) retrieving any necessary information, (ii) calculating, determining, generating, classifying, or otherwise creating any data, and (iii) storing for subsequent use any data calculated, determined, generated, classified, or otherwise created. References to storage or storing indicate storage as a data structure in memory or storage/disks of a computing device (such as logic circuit 302, memory 615, or storage/disks 635 of computing device 605, or in memory 324 or storage 326).

In one embodiment, each subsequent step of a method commences automatically in response to parsing a signal received or stored data retrieved indicating that the previous step has been performed at least to the extent necessary for the subsequent step to commence. Generally, the signal received or the stored data retrieved indicates completion of the previous step.

While for purposes of simplicity of explanation, the illustrated methodologies in the figures are shown and described as a series of blocks of an algorithm, it is to be appreciated that the methodologies are not limited by the order of the blocks. Some blocks can occur in different orders and/or concurrently with other blocks from that shown and described. Moreover, less than all the illustrated blocks may be used to implement an example methodology. Blocks may be combined or separated into multiple actions/components. Furthermore, additional and/or alternative methodologies can employ additional actions that are not illustrated in blocks. The methods described herein are limited to statutory subject matter under 35 U.S.C § 101.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

A "data structure", as used herein, is an organization of data in a computing system that is stored in a memory, a storage device, or other computerized system. A data structure may be any one of, for example, a data field, a data file, a data array, a data record, a database, a data table, a graph, a tree, a linked list, and so on. A data structure may be formed from and contain many other data structures (e.g., a database includes many data records). Other examples of data structures are possible as well, in accordance with other embodiments.

"Computer-readable medium" or "computer storage medium", as used herein, refers to a non-transitory medium that stores instructions and/or data configured to perform one or more of the disclosed functions when executed. Data may function as instructions in some embodiments. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an application specific integrated circuit (ASIC), a programmable logic device, a compact disk (CD), other optical medium, a random access memory (RAM), a read only memory (ROM), a memory chip or card, a memory stick, solid state storage device (SSD), flash drive, and other media from which a computer, a processor or other electronic device can function with. Each type of media, if selected for implementation in one embodiment, may include stored instructions of an algorithm configured to perform one or more of the disclosed and/or claimed functions. Computer-readable media described herein are limited to statutory subject matter under 35 U.S.C § 101.

"Logic", as used herein, represents a component that is implemented with computer or electrical hardware, a non-transitory medium with stored instructions of an executable application or program module, and/or combinations of these to perform any of the functions or actions as disclosed herein, and/or to cause a function or action from another logic, method, and/or system to be performed as disclosed herein. Equivalent logic may include firmware, a microprocessor programmed with an algorithm, a discrete logic (e.g., ASIC), at least one circuit, an analog circuit, a digital circuit, a programmed logic device, a memory device containing instructions of an algorithm, and so on, any of which may be configured to perform one or more of the disclosed functions. In one embodiment, logic may include one or more gates, combinations of gates, or other circuit components configured to perform one or more of the disclosed functions. Where multiple logics are described, it may be possible to incorporate the multiple logics into one logic. Similarly, where a single logic is described, it may be possible to distribute that single logic between multiple logics. In one embodiment, one or more of these logics are corresponding structure associated with performing the disclosed and/or claimed functions. Choice of which type of logic to implement may be based on desired system conditions or specifications. For example, if greater speed is a consideration, then hardware would be selected to implement functions. If a lower cost is a consideration, then stored instructions/executable application would be selected to implement the functions. Logic is limited to statutory subject matter under 35 U.S.C. § 101.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, non-transitory computer-readable medium). Logical and/or physical communication channels can be used to create an operable connection.

"User", as used herein, includes but is not limited to one or more persons, computers or other devices, or combinations of these.

While the disclosed embodiments have been illustrated and described in considerable detail, it is not the intention to restrict or in any way limit the scope of the appended claims to such detail. It is, of course, not possible to describe every conceivable combination of components or methodologies for purposes of describing the various aspects of the subject matter. Therefore, the disclosure is not limited to the specific details or the illustrative examples shown and described. Thus, this disclosure is intended to embrace alterations, modifications, and variations that fall within the scope of the appended claims, which satisfy the statutory subject matter requirements of 35 U.S.C. § 101.

To the extent that the term "includes" or "including" is employed in the detailed description or the claims, it is intended to be inclusive in a manner similar to the term "comprising" as that term is interpreted when employed as a transitional word in a claim.

To the extent that the term "or" is used in the detailed description or claims (e.g., A or B) it is intended to mean "A or B or both". When the applicants intend to indicate "only A or B but not both" then the phrase "only A or B but not both" will be used. Thus, use of the term "or" herein is the inclusive, and not the exclusive use.

What is claimed is:

1. A system comprising:
a processor-based cooling mechanism for cooling one or more components in a computer;
a fan-based cooling mechanism for cooling the one or more components in the computer;
wherein the processor-based cooling mechanism and the fan-based cooling mechanism are configured to operate independent from each other which allows simultaneous operation of both;
a unified controller connected to the processor-based cooling mechanism and the fan-based cooling mechanism, wherein the unified controller is configured to sequentially control operation of the processor-based cooling mechanism and the fan-based cooling mechanism by:
in response to a first condition, allowing the processor-based cooling mechanism to operate and make a first cooling adjustment while locking the operation of the fan-based cooling mechanism; and in response to a second condition, allowing the fan-based cooling mechanism to operate and make cooling adjustments after locking the operation of the processor-based cooling mechanism;
wherein the unified controller is configured to prohibit the processor-based cooling mechanism and the fan-based cooling mechanism from making the cooling adjustments simultaneously.

2. The system of claim 1, wherein the unified controller is further configured to sequentially control the operation of the processor-based cooling mechanism and the fan-based cooling mechanism by:
assigning a first turn in a series of turns to the processor-based cooling mechanism, wherein the first condition is satisfied when the first turn occurs;
assigning a second turn in the series of turns to the fan-based cooling mechanism, wherein the second condition is satisfied when the second turn occurs;
in response to occurrence of a cooling adjustment during the first turn or the second turn, returning to an initial turn of the series; and
in response to no occurrence of the cooling adjustment during the first turn or the second turn, advancing to a next turn in the series.

3. The system of claim 2, wherein the cooling mechanisms are assigned turns based on speed with which the cooling mechanism effects a cooling response in the one or more components.

4. The system of claim 1, further comprising a temperature sensor configured to sense temperature of one of the one or more components in the computer, wherein the unified controller is configured to determine the cooling adjustments by:
determining a margin of thermal headroom between an operating temperature of the component sensed by the temperature sensor and a critical temperature beyond which the component is not to be operated;
comparing the margin of thermal headroom to (i) a first threshold indicating that the cooling adjustments should reduce the operating temperature and (ii) a second threshold indicating that the cooling adjustments should increase the operating temperature; and
in response to the margin of thermal headroom being (a) less than the first threshold, making the cooling adjustments to reduce the operating temperature, (b) greater than the second threshold, making the cooling adjustments to increase the operating temperature, and (c) neither less than the first threshold nor greater than the second threshold, not making the cooling adjustments.

5. The system of claim 4, wherein the unified controller is configured to select, as the margin of thermal headroom, a least margin of thermal headroom in a set of margins of thermal headroom for the one or more components in the computer.

6. The system of claim 1, wherein the processor-based cooling mechanism is a power-based cooling system configured to apply voltage and frequency scaling to adjust a P-state of at least one component of the one or more components of the computer.

7. The system of claim 6, further comprising:
a processor, wherein the processor is the one component; and
a high-speed interface between the unified controller and the processor, wherein the unified controller is a logic circuit configured to adjust the P-state of the processor through the high-speed interface.

8. The system of claim 1, further comprising:
a power-supply-fan-based cooling mechanism for cooling the one or more components in the computer, wherein the power-supply-fan-based cooling mechanism is configured to operate independent from the processor-based cooling mechanism and the fan-based cooling mechanism, which allows simultaneous operation of each cooling mechanism;
wherein the unified controller is configured to sequentially control operation of the power-supply-fan-based cooling mechanism by, in response to a third condition, allowing the power-supply-fan-based cooling mechanism to operate and make cooling adjustments after locking the operation of the processor-based cooling mechanism and locking the operation of the fan-based cooling mechanism;
wherein the unified controller is configured to prohibit the processor-based cooling mechanism, the fan-based cooling mechanism, and the power-supply-fan-based cooling mechanism from making the cooling adjustments simultaneously.

9. A method for unified control of cooling, the method comprising:
locking operation of a power-based cooling mechanism, wherein the power-based cooling mechanism is configured to cool one or more components in a computer;
locking operation of a fluid-based cooling mechanism, wherein the fluid-based cooling mechanism is configured to cool the one or more components in the computer;
in response to a first condition, unlocking the operation of the power-based cooling mechanism to allow the power-based cooling mechanism to make cooling adjustment while the operation of the fluid-based cooling mechanism is locked; and
in response to a second condition, unlocking the operation of the fluid-based cooling mechanism to allow the fluid-based cooling mechanism to make cooling adjustments while the operation of the power-based cooling mechanism is locked;
wherein the power-based cooling mechanism and the fluid-based cooling mechanism are prevented from making the cooling adjustments simultaneously.

10. The method of claim 9, further comprising:
assigning a first turn in a series of turns to the power-based cooling mechanism, wherein the first condition is satisfied when the first turn occurs;
assigning a second turn in the series of turns to the fluid-based cooling mechanism, wherein the second condition is satisfied when the second turn occurs;
in response to occurrence of a cooling adjustment during the first turn or the second turn, returning to an initial turn of the series; and
in response to no occurrence of the cooling adjustment during the first turn or the second turn, advancing to a next turn in the series.

11. The method of claim 10, wherein the cooling mechanisms are assigned turns based on speed with which the cooling mechanism effects a cooling response in the one or more components.

12. The method of claim 9, further comprising:
determining a margin of thermal headroom between an operating temperature of one component of the one or more components sensed by a temperature sensor and a critical temperature beyond which the component is not to be operated;
comparing the margin of thermal headroom to (i) a first threshold indicating that the cooling adjustments should reduce the operating temperature and (ii) a second threshold indicating that the cooling adjustments should increase the operating temperature; and in response to the margin of thermal headroom being (a) less than the first threshold, making the cooling adjustments to reduce the operating temperature, (b) greater than the second threshold, making the cooling adjustments to increase the operating temperature, and (c) neither less than the first threshold nor greater than the second threshold, not making the cooling adjustments.

13. The method of claim 12, wherein the determination of the margin of thermal headroom comprises selecting, as the margin of thermal headroom, a least margin of thermal headroom in a set of margins of thermal headroom for the one or more components in the computer.

14. The method of claim 9, wherein the power-based cooling mechanism cools the one or more components by voltage and frequency scaling to adjust a P-state of at least one component of the one or more components of the computer.

15. The method of claim 9, further comprising:
locking operation of a third cooling mechanism, wherein the third cooling mechanism is configured to cool the one or more components in the computer; and
in response to a third condition, unlocking the operation of the third cooling mechanism to allow the third cooling mechanism to operate and make cooling adjustments while the operation of the power-based cooling mechanism and the operation of the fluid-based cooling mechanism are locked;
wherein the power-based cooling mechanism, the fluid-based cooling mechanism, and the third cooling mechanism are prevented from making the cooling adjustments simultaneously.

16. A method for unified control of cooling, the method comprising:
locking operation of a first cooling mechanism, wherein the first cooling mechanism is configured to cool one or more components in a computer;
locking operation of a second cooling mechanism, wherein the second cooling mechanism is configured to cool the one or more components in the computer;
in response to a first condition, unlocking the operation of the first cooling mechanism to allow the first cooling mechanism to make cooling adjustments while the operation of the second cooling mechanism is locked; and
in response to a second condition, unlocking the operation of the second cooling mechanism to allow the second cooling mechanism to make cooling adjustments while the operation of the first cooling mechanism is locked;
wherein the first cooling mechanism and the second cooling mechanism are prevented from making the cooling adjustments simultaneously.

17. The method of claim 16, further comprising:
assigning a first turn in a series of turns to the first cooling mechanism, wherein the first condition is satisfied when the first turn occurs;
assigning a second turn in the series of turns to the second cooling mechanism, wherein the second condition is satisfied when the second turn occurs;
in response to occurrence of a cooling adjustment during the first turn or the second turn, returning to an initial turn of the series; and
in response to no occurrence of the cooling adjustment during the first turn or the second turn, advancing to a next turn in the series.

18. The method of claim 17, wherein the cooling mechanisms are assigned turns based on speed with which the cooling mechanism effects a cooling response in the one or more components.

19. The method of claim 16, further comprising:
determining a margin of thermal headroom between an operating temperature of one of the one or more components sensed by a temperature sensor and a critical temperature beyond which the component is not to be operated;
comparing the margin of thermal headroom to (i) a first threshold indicating that the cooling adjustments should reduce the operating temperature and (ii) a second threshold indicating that the cooling adjustments should increase the operating temperature; and
in response to the margin of thermal headroom being (a) less than the first threshold, making the cooling adjustments to reduce the operating temperature, (b) greater than the second threshold, making the cooling adjustments to increase the operating temperature, and (c) neither less than the first threshold nor greater than the second threshold, not making the cooling adjustments.

20. The method of claim 16, wherein the first cooling mechanism is a power-based cooling mechanism that cools a component by changing an operational setting of the component, and wherein the second cooling mechanism is a fluid-based cooling mechanism.

* * * * *

UNITED STATES PATENT AND TRADEMARK OFFICE
CERTIFICATE OF CORRECTION

PATENT NO. : 11,729,940 B2
APPLICATION NO. : 17/716489
DATED : August 15, 2023
INVENTOR(S) : Gerdes et al.

It is certified that error appears in the above-identified patent and that said Letters Patent is hereby corrected as shown below:

On the Title Page

On page 2, Column 1, Item (56) under U.S. Patent Documents, Line 5, delete "3,069,490" and insert -- 8,069,490 --, therefor.

On page 2, Column 2, Item (56) under Other Publications, Line 23, delete "AlChE" and insert -- AIChE --, therefor.

On page 2, Column 2, Item (56) under Other Publications, Line 26, delete "Amsterdan," and insert -- Amsterdam, --, therefor.

In the Specification

Figure 6:
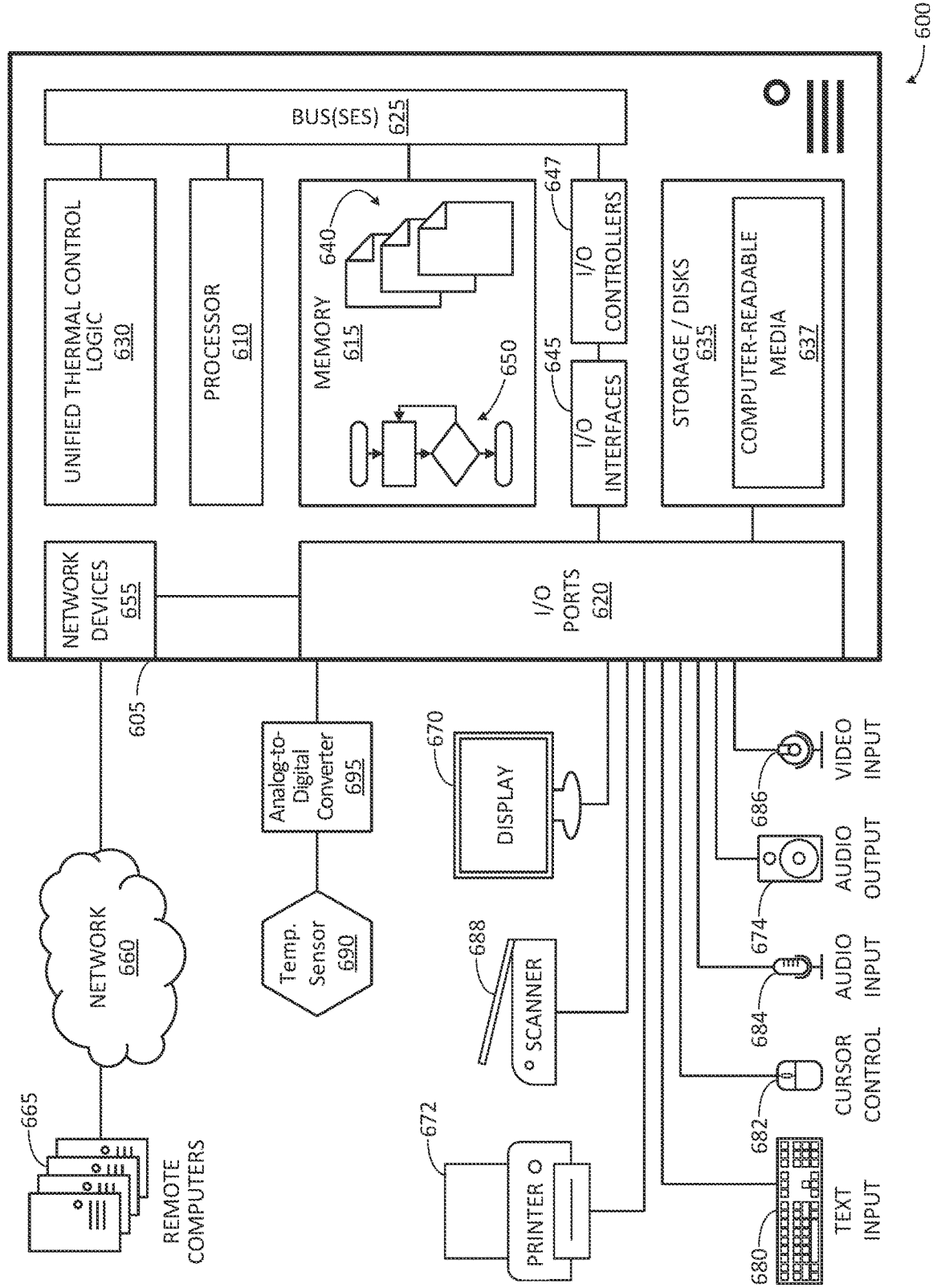
FIG. 6 illustrates an embodiment of a computing system configured with the example systems and/or methods disclosed.

In Column 27, Line 64, delete "FIG. 600" and insert -- FIG. 6 --, therefor.

Signed and Sealed this
Second Day of July, 2024

Katherine Kelly Vidal
Director of the United States Patent and Trademark Office